United States Patent
Uemichi

(10) Patent No.: US 12,107,310 B2
(45) Date of Patent: Oct. 1, 2024

(54) MODE CONVERTER, RF MODULE, AND MOBILE TERMINAL

(71) Applicant: FUJIKURA LTD., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 392 days.

(21) Appl. No.: 17/612,135

(22) PCT Filed: Jun. 5, 2020

(86) PCT No.: PCT/JP2020/022354
§ 371 (c)(1),
(2) Date: Nov. 17, 2021

(87) PCT Pub. No.: WO2020/250830
PCT Pub. Date: Dec. 17, 2020

(65) Prior Publication Data

US 2022/0231390 A1 Jul. 21, 2022

(30) Foreign Application Priority Data

Jun. 10, 2019 (JP) .................................. 2019-108153
Jan. 23, 2020 (JP) .................................. 2020-009352

(51) Int. Cl.
*H01P 5/107* (2006.01)
*H01P 1/161* (2006.01)
(Continued)

(52) U.S. Cl.
CPC ................ *H01P 1/161* (2013.01); *H01P 1/30* (2013.01); *H01P 5/085* (2013.01); *H01P 5/107* (2013.01)

(58) Field of Classification Search
CPC .. H01P 5/107; H01P 5/103; H01P 5/08; H01P 5/087; H01P 3/121; H01P 3/122; H01P 3/12; H05K 1/116
(Continued)

(56) References Cited

U.S. PATENT DOCUMENTS 5,404,117 A * 4/1995 Walz ........................ H01P 5/085
333/260
5,793,263 A * 8/1998 Pozar ...................... H01P 5/107
333/33
(Continued)

FOREIGN PATENT DOCUMENTS

CN 104904061 A 9/2015
EP 0853348 A2 7/1998
(Continued)

OTHER PUBLICATIONS

Uemichi, Yusuke et al., "A ultra low-loss silica-based transformer between microstrip line and post-wall waveguide for millimeter-wave antenna-in-package applications," IEEE MTT-S IMS, Jun. 2014; Cited in the Specification. (3 pages).
(Continued)

*Primary Examiner* — Stephen E. Jones
(74) *Attorney, Agent, or Firm* — WHDA, LLP

(57) ABSTRACT

A mode converter which converts between a mode of a post-wall waveguide and a mode of a line in which a strip-shaped conductor is formed on another substrate different from a substrate of the post-wall waveguide, is less likely to cause a transmission failure resulting from a change in environmental temperature. A mode converter (10) includes: a post-wall waveguide (PW) in which an opening (121) is provided in a wide wall (conductor layer 12); a dielectric substrate (15) having a main surface on which a strip-shaped conductor (16) is formed; and a joining member (solder 18) joining the wide wall (conductor layer 12) and
(Continued)

the substrate (15), wherein in a plan view, the opening (121) and the strip-shaped conductor (16) overlap each other.

13 Claims, 22 Drawing Sheets

(51) Int. Cl.
   *H01P 1/30* (2006.01)
   *H01P 5/08* (2006.01)
(58) Field of Classification Search
   USPC .......................................................... 333/26
   See application file for complete search history.

(56) References Cited

U.S. PATENT DOCUMENTS

| | | | | |
|---|---|---|---|---|
| 5,982,256 | A * | 11/1999 | Uchimura | H05K 1/0219 |
| | | | | 333/248 |
| 7,199,680 | B2 * | 4/2007 | Fukunaga | H01P 5/107 |
| | | | | 333/248 |
| 2016/0126636 | A1 * | 5/2016 | Uemichi | H01Q 21/0043 |
| | | | | 343/771 |
| 2019/0190142 | A1 * | 6/2019 | Nagaishi | H01Q 1/526 |
| 2019/0348740 | A1 * | 11/2019 | Seo | H01P 5/1022 |

FOREIGN PATENT DOCUMENTS

| | | |
|---|---|---|
| JP | 2000-013137 A | 1/2000 |
| JP | 2005-51331 A | 2/2005 |
| JP | 2014-236291 A | 12/2014 |
| JP | 2018-23088 A | 2/2018 |
| WO | 2018/221486 A1 | 12/2018 |

OTHER PUBLICATIONS

Written Opinion dated Jun. 30, 2020, issued in counterpart Application No. PCT/JP2020/022354, with English translation and International Preliminary Report on Patentability form PCT/IB/373 dated Dec. 14, 2021. (9 pages).

International Search Report dated Jun. 30, 2020, issued in counterpart Application No. PCT/JP2020/022354. (2 pages).

* cited by examiner

A–A'

MODE CONVERTER, RF MODULE, AND MOBILE TERMINAL

TECHNICAL FIELD

The present invention relates to a mode converter that converts between a mode of a post-wall waveguide and a mode of a line including a strip-shaped conductor. The present invention also relates to an RF module and a mobile terminal both of which include such a mode converter.

BACKGROUND ART

Non-patent Literature 1 discloses a mode converter that carries out mutual conversion between a guide mode of a post-wall waveguide and a guide mode of a microstrip line.

An RF module 101 including such conventional mode converters 110a and 110b is illustrated in FIGS. 16 and 17. FIG. 16 is an exploded perspective view illustrating the RF module 101, and FIG. 17 is a cross-sectional view illustrating the RF module 101.

In the mode converters 110a and 110b, a post-wall waveguide PW includes: a dielectric substrate 111; a pair of conductor layers 112 and 113 formed respectively on a pair of main surfaces of the substrate 111; and a post wall 114 formed inside the substrate 111. In the pair of conductor layers 112 and 113, a region surrounded by the post wall 114 in a plan view functions as a pair of wide walls between which a rectangular-parallelepiped-shaped waveguide region is sandwiched from two directions (for example, up and down directions), and the post wall functions as a pair of narrow walls and a pair of short walls surrounding the waveguide region from four directions (for example, front, rear, left, and right directions). The post wall 114 is constituted by a plurality of through-vias which are provided in a fence-like manner inside the substrate 111 and which short-circuit the pair of conductor layers.

Further, in the mode converters 110a and 110b, the microstrip line MS includes: strip-shaped conductors 116a and 116b which functions as a signal line; a ground layer constituted by the conductor layer 112; and a dielectric layer 115 which separates the signal line and the ground layer. The microstrip line MS is formed directly on one of the main surfaces of the post-wall waveguide.

In addition, to carry out mutual conversion between the guide mode of the post-wall waveguide PW and the guide mode of the microstrip line MS, the mode converters 110a and 110b include blind vias BVa and BVb that are connected to first ends of the strip-shaped conductors 116a and 116b which constitute the microstrip line MS. The blind vias BVa and BVb function as excitation pins. The excitation pins may be blind vias or may be through-vias.

In the mode converters 110a and 110b, the strip-shaped conductors 116a and 116b can be used respectively as an input port and an output port of the post-wall waveguide PW. For example, as illustrated in FIGS. 16 and 17, the RF module 101 is obtained by forming the mode converters 110a and 110b respectively at both ends of the post-wall waveguide PW (near the short walls), mounting a radio frequency integrated circuit (RFIC) 121 on the strip-shaped conductor 116a of the mode converter 110a, and mounting an antenna 122 on the strip-shaped conductor 116b of the mode converter 110b. The RF module 101 is an RF module in which the RFIC 121 and the antenna 122 are mounted directly on one of the main surfaces of the post-wall waveguide PW.

Regarding such an RF module, there is a demand for manufacturing the RF module by mounting an RFIC and an antenna in advance on another substrate (referred to as a mounting substrate) which differs from the substrate constituting the post-wall waveguide, and then joining the mounting substrate and the post-wall waveguide. An RF module 101A having such a configuration is illustrated in FIG. 18. FIG. 18 is a cross-sectional view illustrating the RF module 101A.

To realize such a demand, it is possible to employ an aspect in which, as illustrated in FIG. 18, strip-shaped conductors 116Aa and 116Ab are drawn to a back side of the mounting substrate (a side closer to the post-wall waveguide PW) using through-vias, and then the strip-shaped conductors 116Aa and 116Ab drawn to the back side of the mounting substrate and blind vias BVa and BVb are joined with use of bumps Ba and Bb.

CITATION LIST

Non-Patent Literature

[Non-Patent Literature 1]
Yusuke Uemichi, et al. "A ultra low-loss silica-based transformer between microstrip line and post-wall waveguide for millimeter-wave antenna-in-package applications," IEEE MTT-S IMS, June. 2014.

SUMMARY OF INVENTION

Technical Problem

As a dielectric constituting the substrate 111 of the post-wall waveguide PW, quartz, ceramics, sapphire, silicon, etc. are often employed. On the other hand, as a dielectric constituting a mounting substrate 115A, a fluorine resin (for example, Teflon (registered trademark)), a glass epoxy resin, a liquid crystal polymer, a polyimide resin, cycloolefin, etc. are often employed. In such a case, the linear expansion coefficient of the dielectric constituting the substrate 111 and the linear expansion coefficient of the dielectric constituting the mounting substrate 115A differ greatly. Thus, a stress is repeatedly added to the bumps Ba and Bb with a change in environmental temperature at which the RF module 101A is used, and eventually causes cracks in either one or both of the bumps Ba and Bb. This may cause transmission failure either between the RFIC 121 and the post-wall waveguide PW or between the antenna 122 and the post-wall waveguide PW or both between the RFIC 121 and the post-wall waveguide PW and between the antenna 122 and the post-wall waveguide PW (see FIG. 18).

To strengthen joining between the mounting substrate 115A and the post-wall waveguide PW, it is also possible to employ an aspect in which a solder 118 is used to join a main surface of the mounting substrate 115A and a main surface of the post-wall waveguide PW, both of which main surfaces face each other (see FIG. 18). However, since the linear expansion coefficient of the dielectric constituting the substrate of the post-wall waveguide PW and the linear expansion coefficient of the dielectric constituting the mounting substrate differ greatly, it is difficult to prevent the occurrence of cracks even though the solder 118 is used in addition to the bumps Ba and Bb.

An aspect of the present invention has been made in view of the above problems. It is an object of the aspect of the present invention to provide a mode converter that converts between a mode of a post-wall waveguide and a mode of a line in which a strip-shaped conductor formed on another substrate different from a substrate of a post-walled waveguide serves as a signal line, wherein the mode converter is less likely to cause a transmission failure resulting from a change in environmental temperature than the conventional mode converter. Further, it is an object of the aspect of the present invention to provide an RF module and a mobile terminal both of which include such a mode converter.

Solution to Problem

A mode converter in accordance with an aspect of the present invention includes: a post-wall waveguide in which an opening is provided in a first wide wall; a dielectric substrate having a first main surface and a second main surface on at least one of which a strip-shaped conductor is formed; and a joining member joining directly or indirectly the first wide wall and the substrate, wherein at least a portion of the opening and at least a portion of the strip-shaped conductor overlap each other in a plan view of the post-wall waveguide.

An RF module in accordance with an aspect of the present invention includes: a post-wall waveguide in which a first opening is provided in a vicinity of a first short wall of a first wide wall, and a second opening is provided in a vicinity of a second short wall of the first wide wall; a dielectric substrate having a first main surface and a second main surface, wherein a first strip-shaped conductor is formed on at least one of the first main surface and the second main surface, a second strip-shaped conductor is formed on at least one of the first main surface and the second main surface, and an antenna is formed on at least one of the first main surface and the second main surface; a joining member joining directly or indirectly the first wide wall and the substrate; and an RFIC being mounted on the first main surface of the substrate and having terminals any of which is electrically connected to the first strip-shaped conductor, wherein the antenna is electrically connected to the second strip-shaped conductor, and in a plan view of the post-wall waveguide, at least a portion of the first opening and at least a portion of the first strip-shaped conductor overlap each other, and at least a portion of the second opening and at least a portion of the second strip-shaped conductor overlap each other.

A mobile terminal in accordance with an aspect of the present invention includes: an RF module in accordance with an aspect of the present invention as at least one of a transmission module, a reception module, and a transmission/reception module.

An RF module in accordance with an aspect of the present invention includes: a post-wall waveguide having a waveguide region formed by a pair of wide walls, narrow walls, and a pair of short walls, wherein (1) a first opening is provided in a first end region which is in a first wide wall of the pair of wide walls and includes a first short wall, (2) a second opening is provided in a second end region which is in the first wide wall of the pair of wide walls and includes a second short wall, and (3) the first end region and the second end region are arranged so as to be parallel to and close to each other; a dielectric substrate having a first main surface and a second main surface on at least one of which a third strip-shaped conductor and a fourth strip-shaped conductor are formed; a joining member joining directly or indirectly the first wide wall and the substrate; and an RFIC being mounted on the first main surface of the substrate and having an output terminal and an input terminal which are electrically connected to the third strip-shaped conductor and the fourth strip-shaped conductor, respectively, wherein in a plan view of the post-wall waveguide, at least a portion of the first opening and at least a portion of the third strip-shaped conductor overlap each other, and at least a portion of the second opening and at least a portion of the fourth strip-shaped conductor overlap each other.

Advantageous Effects of Invention

According to an aspect of the present invention, it is possible to provide a mode converter that converts between a mode of a post-wall waveguide and a mode of a line in which a strip-shaped conductor formed on another substrate different from a substrate of a post-walled waveguide serves as a signal line, wherein the mode converter is less likely to cause a transmission failure resulting from a change in environmental temperature than the conventional mode converter. Further, according to an aspect of the present invention, it is possible to provide an RF module and a mobile terminal both of which include such a mode converter.

DESCRIPTION OF EMBODIMENTS

Embodiment 1

Figure 1:
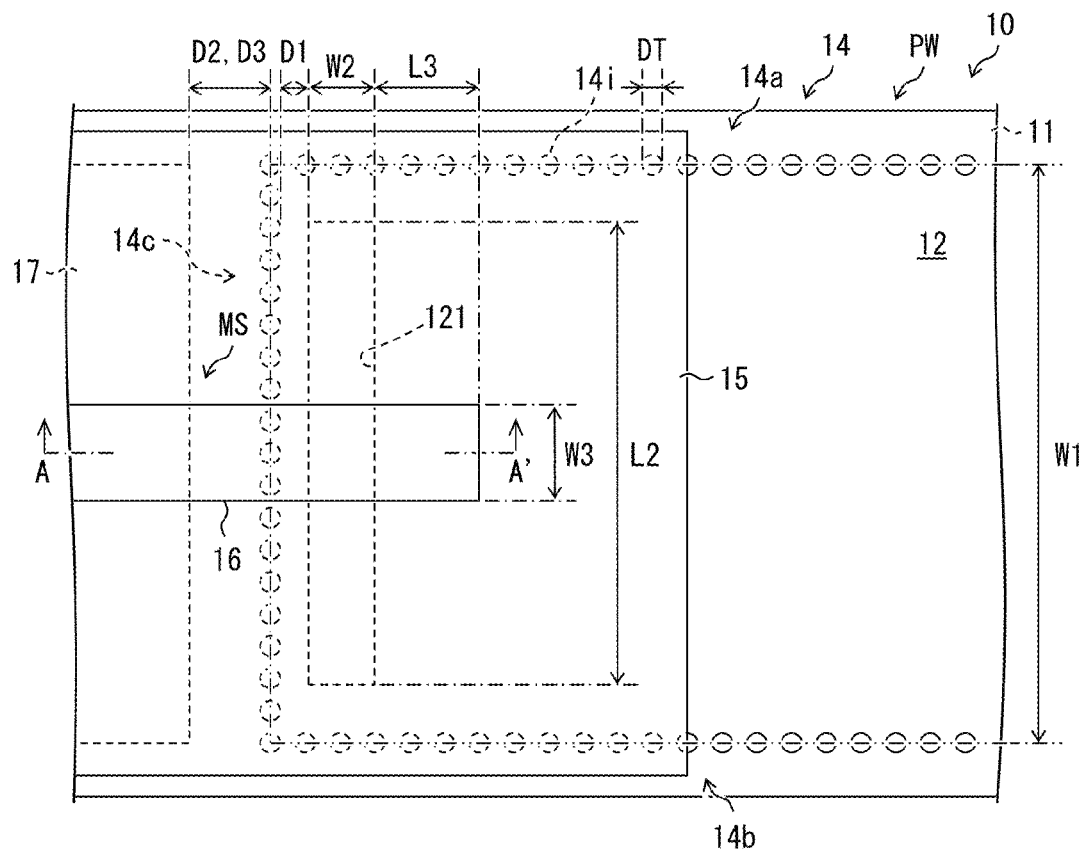
FIG. 1 is a plan view illustrating a mode converter in accordance with Embodiment 1 of the present invention.
Figure 2:
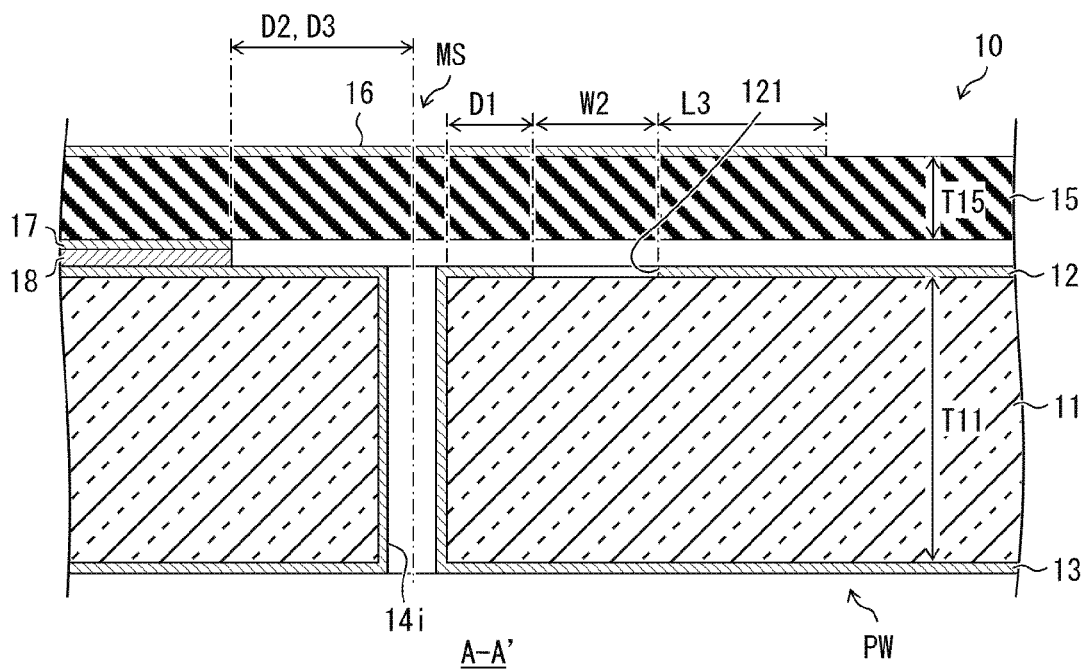
FIG. 2 is a cross-sectional view illustrating the mode converter illustrated in FIG. 1.

The following description will discuss, with reference to FIGS. 1 and 2, a mode converter 10 in accordance with Embodiment 1 of the present invention. FIG. 1 is a plan view illustrating the mode converter 10. FIG. 2 is a cross-sectional view illustrating the mode converter 10 and is a cross-sectional view taken along the line A-A' illustrated in FIG. 1. Note that all of mode converters and RF modules in accordance with embodiments of the present invention assume a 28 GHz band (for example, a band of not less than 27 GHz and not more than 29.5 GHz) as an operating band.

<Configuration of Mode Converter 10>

As illustrated in FIGS. 1 and 2, the mode converter 10 includes a post-wall waveguide PW, a microstrip line MS, and a solder 18. The post-wall waveguide PW and the microstrip line MS will be discussed later. The solder 18 short-circuits a conductor layer 12 of the post-wall waveguide PW and a conductor layer 17 of the microstrip line MS and is an example of a joining member for joining the conductor layer 12 of the post-wall waveguide PW and the conductor layer 17 of the microstrip line MS. The solder 18 joins the conductor layer 12 and the conductor layer 17 in a state in which the conductor layer 12 and the conductor layer 17 are parallel or substantially parallel to each other. As discussed later, the conductor layer 17 is formed on a main surface of the substrate 15 which main surface is on a side closer to the conductor layer 12 out of a pair of opposed main surfaces of the substrate 15. Thus, it can be said that the solder 18 indirectly joins the conductor layer 12 and the substrate 15 via the conductor layer 17. Hereinafter, out of the pair of opposed main surfaces of the substrate 15, a main surface on a side farther from the conductor layer 12 is also referred to as a first main surface, and a main surface on a side closer to the conductor layer 12 is also referred to as a second main surface. Hereinafter, the shortest distance between central axes of through-vias 14$i$ constituting a short wall 14$c$ (discussed later) and the solder 18 is referred to as a distance D3. The distance D3 can be determined as appropriate, but in the present embodiment, D3=850 µm.

(Post-Wall Waveguide PW)

As illustrated in FIGS. 1 and 2, the post-wall waveguide PW includes a substrate 11, conductor layers 12 and 13, and a post wall 14.

The substrate 11 is a plate-like member made of a dielectric and is made of quartz in the present embodiment. The dielectric constituting the substrate 11 is not limited to quartz, and can be selected as appropriate from among dielectrics capable of suppressing transmission loss when employed as a substrate of a post-wall waveguide, according to, for example, the center frequency or the like of the mode converter 10. Note that the thickness T11 of the substrate 11 can be selected as appropriate.

The conductor layers 12 and 13 are layer members that are formed respectively on a pair of opposed main surfaces of the substrate 11. The conductor layers 12 and 13 are layer members made of a conductive material, and are made of copper in the present embodiment. The conductive material of which the conductor layers 12 and 13 are made is not limited to copper and can be selected as appropriate. Further, the thicknesses of the conductor layers 12 and 13 can be selected as appropriate, and each of the conductor layers 12 and 13 may be a relatively thin layer member called a conductor film, or may be a relatively thick layer member called a conductor plate.

The post wall 14 is constituted by a plurality of through-vias 141 to 14n provided in a fence-like manner inside the substrate 11. Here, n is an arbitrary integer greater than or equal to 2. Further, hereinafter, the through vias 141 to 14n are generalized and are also each referred to as through-vias 14i. Here, i is an integer not less than 1 and not more than n. The post wall 14 is composed of a pair of opposed narrow walls 14a and 14b, a short wall 14c, and another short wall (not illustrated in FIGS. 1 and 2) facing the short wall 14c. Each of the through-vias 14i is constituted by a cylindrical or columnar conductor (cylindrical conductor in the present embodiment).

Each of the through-vias 14i extends from the first main surface of the substrate 11 to the second main surface of the substrate 11, and short-circuits the conductor layer 12 and the conductor layer 13. Further, the diameter DT (see FIG. 1) of each of the through-vias 14i can be determined as appropriate according to the width W1 of the post-wall waveguide PW, the complexity of the shape of the post-wall waveguide PW, and the like, but in the present embodiment, DT=100 μm.

In the mode converter 10, the conductor layers 12 and are provided so as to sandwich the substrate 11 therebetween from two directions (for example, up and down directions), the narrow walls 14a and 14b are provided so as to sandwich a partial region of the substrate 11 therebetween from two directions (for example, left and right directions), and the short wall 14c and the another short wall are provided so as to sandwich the partial region of the substrate 11 therebetween from two directions (for example, front and rear directions). The partial region of the substrate 11 sandwiched by the conductor layers 12 and 13, the narrow walls 14a and 14b, the short wall 14c, and the another short wall from six directions functions as a waveguide region of the mode converter 10. This waveguide region is illustrated as a region surrounded on three sides by a chain double-dashed line in FIG. 1. In FIG. 2, the waveguide region is illustrated as a region which is on the right side of the through-vias 14i and which is sandwiched between the conductor layer 12 and the conductor layer 13. Note that the chain double-dashed line illustrated in FIG. 1 is a straight line passing through the respective centers of the through-vias 14i. As illustrated in FIG. 1, the narrow wall 14a and the narrow wall 14b are parallel to each other, and the short wall 14c is orthogonal to the narrow walls 14a and 14b. Hereinafter, spacing between the narrow wall 14a and the narrow wall 14b is referred to as a width W1 of the post-wall waveguide PW. The width W1 can be determined as appropriate according to the operating band or the like, but in the present embodiment, W1=4 mm.

As illustrated in FIGS. 1 and 2, an opening 121 is provided in the conductor layer 12 constituting a first wide wall of the post-wall waveguide PW. The opening 121 is rectangular in shape and is provided in the vicinity of the short wall 14c such that a long side of the opening 121 extends along the short wall 14c (the long side of the opening 121 is parallel to the short wall 14c in the present embodiment) and a short side of the opening 121 extends along the narrow walls 14a and 14b (the short side of the opening 121 is parallel to the narrow walls 14a and 14b in the present embodiment). Hereinafter, the shortest distance between the opening 121 and the short wall 14c is referred to as a distance D1, the width of the opening 121 (length along the short side) is referred to as a width W2, and the length (length along the long side) is referred to as a length L2. The distance D1, the width W2, and the length L2 can be determined as appropriate according to the operating band or the like, but in the present embodiment, D1=100 μm, W2=400 μm, and L2=3.2 mm. The post-wall waveguide PW configured as above functions as a TE line, and guides high-frequency waves coupled to the waveguide region via the opening 121, along the long-axis direction of the waveguide region.

(Microstrip Line MS)

As illustrated in FIGS. 1 and 2, the microstrip line MS includes the substrate 15, a strip-shaped conductor 16, and the conductor layer 17.

The substrate 15 is a plate-like member made of a dielectric. The dielectric constituting the substrate 15 can be selected as appropriate from among dielectrics capable of suppressing transmission loss when employed as a substrate of a microstrip line, according to, for example, the center frequency or the like of the mode converter 10. Note that the thickness T15 of the substrate 15 can be selected as appropriate.

Further, a substrate portion of a commercially available mounting substrate (for example, Megtron6 (registered trademark), Rogers RT/duroid (registered trademark) 5880, etc.) can also be used as the substrate 15. In this case, the strip-shaped conductor 16 (discussed later) can be formed by patterning a conductor layer which is a first main surface out of a pair of opposed main surfaces of the mounting substrate, and the conductor layer 17 (discussed later) can be formed by patterning a conductor layer which is a second main surface of the mounting substrate.

The strip-shaped conductor 16 is a rectangular conductor pattern formed on a first main surface of the substrate 15 (in FIG. 2, a main surface on a side farther from the conductor layer 12 of the post-wall waveguide PW) and functions as a signal line of the microstrip line MS. Hereinafter, the width of the strip-shaped conductor 16 is referred to as a width W3, and the length of a tip part of the strip-shaped conductor 16 which tip part protrudes from the opening 121 in a plan view is referred to as a length L3. The width W3 and the length L3 can be determined as appropriate according to the operating band or the like, but in the present embodiment, W3=600 μm and L3=600 μm.

The length L3 affects impedance matching between the microstrip line MS and the post-wall waveguide PW. Thus, suitably designing the length L3 enables enhancement of the impedance matching, and hence enables suppression of reflection loss in the mode converter 10.

The conductor layer 17 is a conductor pattern formed on a second main surface of the substrate 15 (in FIG. 2, a main surface on a side closer to the conductor layer 12 of the post-wall waveguide PW), and functions as a ground layer of the microstrip line MS. In the present embodiment, as illustrated in FIG. 1, the conductor layer 17 is formed outside the waveguide region of the post-wall waveguide PW (that is, the region surrounded by the post wall 14) in a plan view. Hereinafter, the shortest distance between the central axes of the through-vias 14i constituting the short wall 14c and the conductor layer 17 is referred to as a distance D2. The distance D2 can be determined as appropriate, but in the present embodiment, D2=850 μm. That is, in the present embodiment, D2=D3 (see FIGS. 1 and 2). Note that the region where the conductor layer 17 is formed and the distance D2 can be designed as appropriate according to the position where the opening 121 is formed or the like, and may extend from outside of the waveguide region to the vicinity of the opening 121. Furthermore, in a plan view, the conductor layer 17 may not be formed in a region facing at least the opening 121 in the second main surface of the substrate 15, and the conductor layer 17 may be formed in a part of a region other than the region facing the opening 121 or may be formed in an entire region other than the region facing the opening 121.

The strip-shaped conductor 16 and the conductor layer 17 are made of a conductive material, and are made of copper in the present embodiment. The conductive material of which the strip-shaped conductor 16 and the conductor layer 17 are made is not limited to copper and can be selected as appropriate. Further, the thickness and width of the strip-shaped conductor 16 and the thickness of the conductor layer 17 can be selected as appropriate, and each of the strip-shaped conductor 16 and the conductor layer 17 may be a relatively thin layer member called a conductor film, or may be a relatively thick layer member called a conductor plate.

In the region illustrated in FIG. 1, the strip-shaped conductor 16 is rectangular in shape. However, the strip-shaped conductor 16 only needs to be arranged such that at least a vicinity of a region which overlaps the opening 121 in a plan view is in the shape of a strip, and an end portion of the strip-shaped conductor 16 on a side farther from the opening 121 may be patterned in any shape. At the end portion on the side farther from the opening 121, a conductor pad can be formed for connecting, for example, a terminal of a radio frequency integrated circuit (RFIC). Further, in the present embodiment, an end portion of the strip-shaped conductor 16 on the side closer to the opening 121 is patterned so as to have two corners. However, the shape of the end portion on the side closer to the opening 121 is not limited.

In a plan view of the post-wall waveguide PW (see FIG. 1), the strip-shaped conductor 16 is arranged such that the end portion of the strip-shaped conductor 16 on the side farther from the opening 121 is arranged outside the waveguide region of the post-wall waveguide PW, a strip-shaped part of the strip-shaped conductor 16 crosses the short wall 14c and the opening 121, and the end portion of the strip-shaped conductor 16 on the side closer to the opening 121 is arranged in the waveguide region in the vicinity of the opening 121. Thus, in the mode converter 10, a portion of the opening 121 in the vicinity of a center of the opening 121 and a portion of the strip-shaped conductor 16 overlap each other, in a plan view of the post-wall waveguide PW.

The microstrip line MS configured as above is an aspect of a line called a quasi-TEM line or a two-conductor line.

In the present embodiment, the strip-shaped conductor 16 is formed only on the first main surface of the substrate 15. For example, a strip-shaped conductor, as with the strip-shaped conductor 16C illustrated in FIG. 5, may be formed on both of the main surfaces of the substrate 15.

Further, in the present embodiment, the mode converter 10 has been discussed in which the microstrip line MS is used as a line provided by forming a strip-shaped conductor on at least one of the first main surface of the substrate 15 and the second main surface thereof. However, in an aspect of the present invention, the line provided by forming the strip-shaped conductor on at least one of the first main surface of the substrate 15 and the second main surface thereof is not limited to the microstrip line MS. Such a line may be a strip line, may be a coplanar line, may be a grounded coplanar line, or may be a parallel two-wire line.

(Mode Conversion)

In the mode converter 10, the mode of the microstrip line MS and the mode of the post-wall waveguide PW are coupled via a region in which a portion of the strip-shaped conductor 16 and a portion of the opening 121 overlap each other in a plan view. That is, the mode converter 10 can convert between these modes via the opening 121 which does not directly contact the strip-shaped conductor 16, without using an excitation pin.

(Gap Between the Conductor Layer 12 and the Substrate 15)

As illustrated in FIG. 2, a void, including a portion of the opening 121, is formed between the conductor layer 12 and the substrate 15. This void may remain in the state of a gap (i.e., the void may remain filled with air) or may be filled with a dielectric such as a resin material. In a case where the resin material is filled into the void, most part of the void can be considered to be filled with the resin material, for example, if the resin material which is in a liquid form before curing is injected through any of the through-vias 14i, and it is observed that the resin material is poured out from another through-via 14i which differs from the through-via 14i through which the resin material is injected. Thereafter, the resin material may be cured.

In a case where the void is filled with a dielectric, it is possible to lessen discontinuity of a relative dielectric constant which can occur between the substrate 11 and the substrate 15 by appropriately selecting the dielectric with which the void is to be filled.

(Function of the Post-Wall Waveguide PW)

In the mode converter 10, the post-wall waveguide PW may be such that the waveguide region is configured so that the post-wall waveguide PW functions as any of a filter, a directional coupler, a diplexer, and an antenna. In a case where the post-wall waveguide PW is used to realize the function of any of the filter, the directional coupler, the diplexer, and the antenna, a component suitable for an application may be selected as appropriate from an existing filter, an existing directional coupler, an existing diplexer, and an existing antenna. Note that the antenna is preferably an array antenna.

<First Variation>

Figure 3:
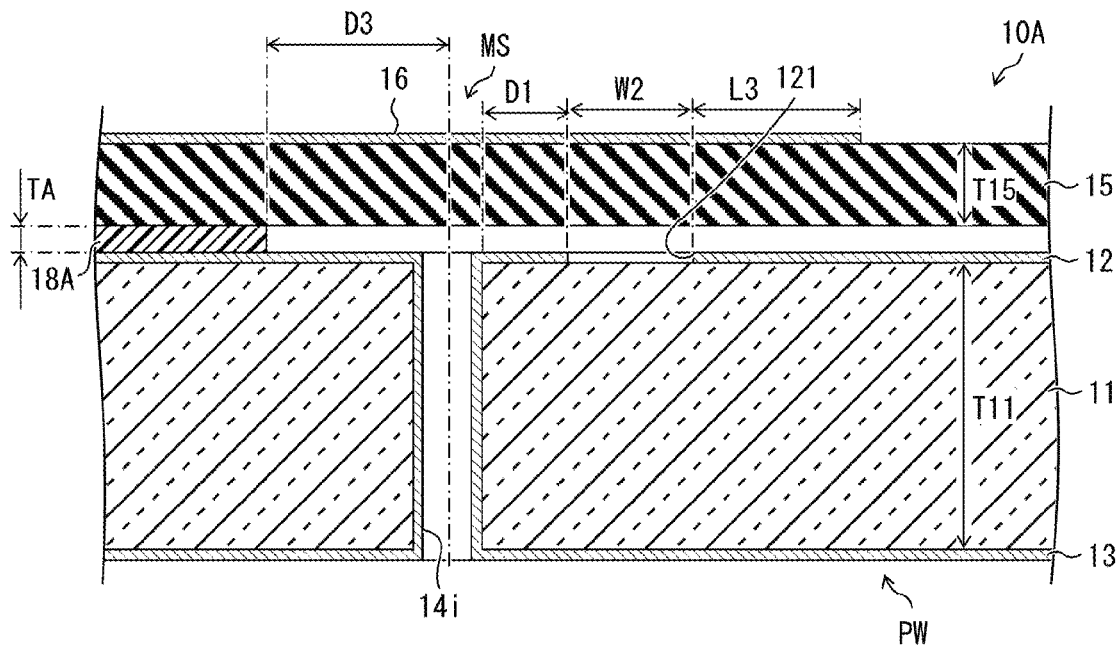
FIG. 3 is a cross-sectional view illustrating a first variation of the mode converter illustrated in FIG. 1.

The following description will discuss, with reference to FIG. 3, a mode converter 10A in accordance with a first variation of the present invention, wherein the mode converter 10A is a variation of the mode converter 10 illustrated in FIGS. 1 and 2. FIG. 3 is a cross-sectional view illustrating the mode converter 10A.

The mode converter 10A is based on the mode converter 10 and is obtained by omitting the conductor layer 17 from the mode converter 10 and replacing the solder 18 with an adhesive 18A. The adhesive 18A is made of a non-conductive resin material. The adhesive 18A directly joins the conductor layer 12 and the substrate 15. Hereinafter, the thickness of the adhesive 18A is referred to as a thickness TA. By designing the thickness TA as appropriate, it is possible to adjust the degree of joining between the strip-shaped conductor 16 and the conductor layer 12 in the microstrip line MS.

Even when the conductor layer 17 is omitted, the conductor layer 12 of the post-wall waveguide PW functions as a ground layer of the microstrip line MS. Thus, it can be said that the microstrip line MS of the mode converter 10A includes the substrate 15, the strip-shaped conductor 16, and the conductor layer 12.

The mode converter 10A configured as above brings about the same effect as the effect brought about by the mode converter 10.

Further, in FIG. 3, a void is formed between the conductor layer 12 and the substrate 15. However, as discussed earlier, this void may remain in the state of a gap (i.e., the void may remain filled with air) or may be filled with a dielectric such as a resin material. In the mode converter 10A, the conductor layer 12 and the substrate 15 can be joined, without forming the void, by, for example, applying the adhesive 18A onto the main surface of the substrate 15 and then putting the substrate 15 on the conductor layer 12.

The adhesive 18A has a higher modulus of elasticity than the solder 18, and thus can reduce the stress that can occur with a change in environmental temperature.

<Second Variation>

Figure 4:
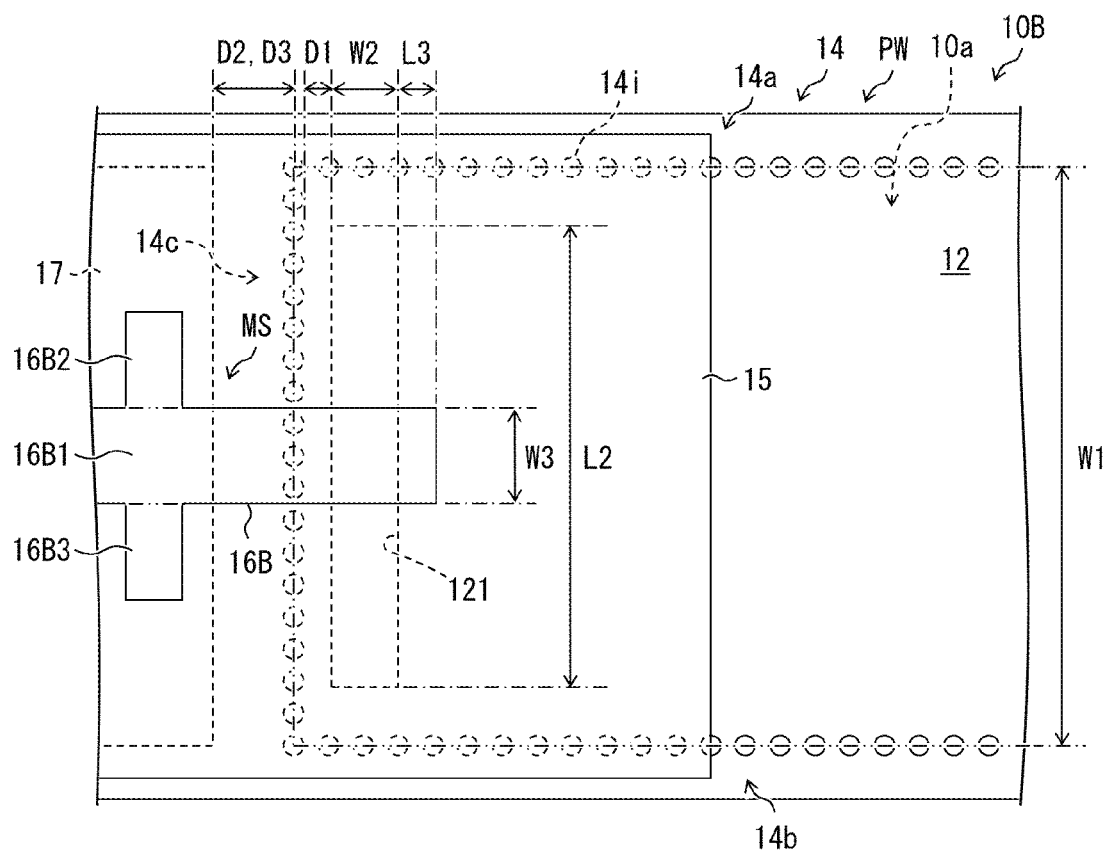
FIG. 4 is a plan view illustrating a second variation of the mode converter illustrated in FIG. 1.

The following description will discuss, with reference to FIG. 4, a mode converter 10B in accordance with a second variation of the present invention, wherein the mode converter 10B is a variation of the mode converter 10 illustrated in FIGS. 1 and 2. FIG. 4 is a plan view illustrating the mode converter 10B.

The mode converter 10B is based on the mode converter 10 and is obtained by replacing the strip-shaped conductor 16 included in the mode converter 10 with a strip-shaped conductor 16B. In the present variation, the strip-shaped conductor 16B is such that the length L3 of the strip-shaped conductor 16B is designed so as to be shorter than the length L3 of the strip-shaped conductor 16, and L3=200 μm.

The strip-shaped conductor 16B, as illustrated in FIG. 4, includes a strip-shaped main part 16B1 and two stubs 16B2 and 16B3 each of which is rectangular in shape. The main part 16B1 is a conductor pattern corresponding to the strip-shaped conductor 16, and each of the stubs 16B2 and 16B3 is a conductor pattern which is rectangular in shape. The main part 16B1 and the stubs 16B2 and 16B3 form the strip-shaped conductor 16B, which is a single conductor pattern.

The stubs 16B2 and 16B3 are provided, in a plan view, at any respective positions in a section outside the waveguide region of the post-wall waveguide PW in the main part 16B1, wherein the positions are linearly symmetrical about the central axis of the strip-shaped main part 16B1 as a symmetrical axis.

In the present variation, the stubs 16B2 and 16B3 are rectangular in shape, and are arranged such that long sides of the stubs 16B2 and 16B3 cross the symmetrical axis (in the present embodiment, they are orthogonal to the symmetrical axis) and short sides of the stubs 16B1 and 16B2 extend along the symmetrical axis (in the present embodiment, they are parallel to the symmetrical axis). However, the shape of the stubs 16B2 and 16B3 and the orientation of the stubs 16B2 and 16B3 being arranged are not limited to those in accordance with an aspect of the present variation. The stubs 16B2 and 16B3 may be open stubs having open ends, as illustrated in FIG. 4, or may be stubs called short stubs which are short-circuited.

As discussed earlier, in the present variation, the length L3 is designed so as to be shorter than the length L3 of the strip-shaped conductor 16. Thus, in a case where a strip-shaped conductor with no stubs, as with the strip-shaped conductor 16, is employed in the mode converter 10B, impedance matching becomes poorer than that in the mode converter 10. In a case where impedance matching is poor as discussed above, designing the stubs 16B2 and 16B3 as appropriate achieves impedance matching between the microstrip line MS and the post-wall waveguide PW, and hence enables suppression of reflection loss in the mode converter 10B.

<Third Variation>

Figure 5:
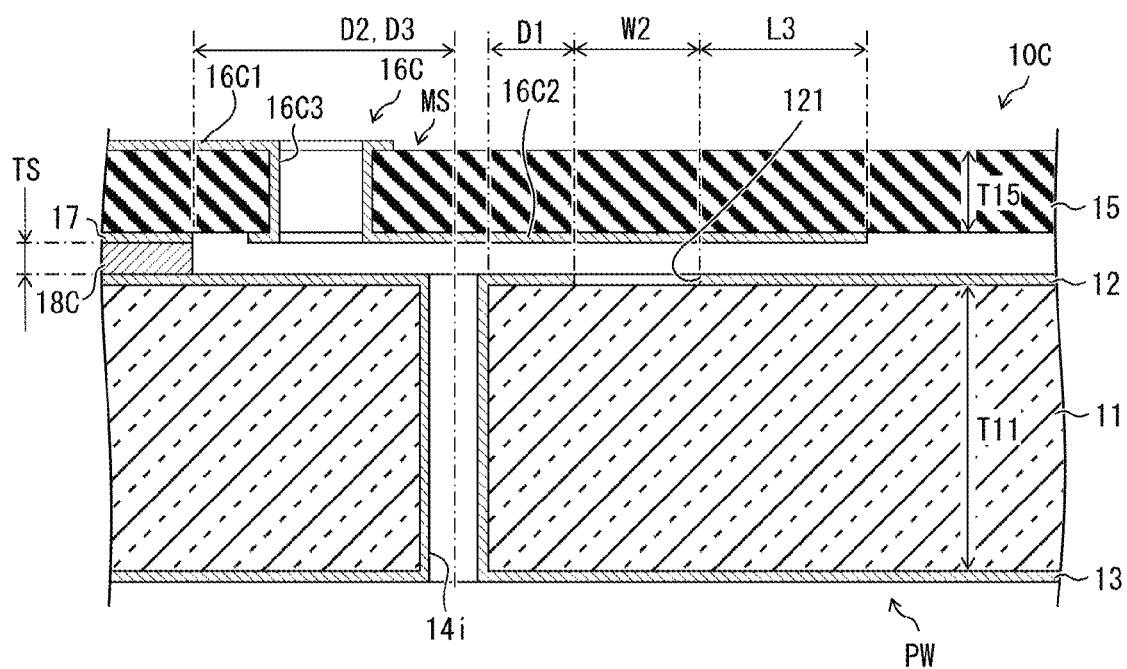
FIG. 5 is a cross-sectional view illustrating a third variation of the mode converter illustrated in FIG. 1.

The following description will discuss, with reference to FIG. 5, a mode converter 10C in accordance with a third variation of the present invention, wherein the mode converter 10C is a variation of the mode converter 10 illustrated in FIGS. 1 and 2. FIG. 5 is a cross-sectional view illustrating the mode converter 10C.

The mode converter 10C is based on the mode converter 10 and is obtained by replacing the strip-shaped conductor 16 included in the mode converter 10 with the strip-shaped conductor 16C.

The strip-shaped conductor 16C, as illustrated in FIG. 5, includes a first conductor pattern 16C1 and a second conductor pattern 16C2. The first conductor pattern 16C1 and the second conductor pattern 16C2 are each strip-shaped conductor patterns. As discussed later, the first conductor pattern 16C1 is formed on a first main surface of the substrate 15 (on a main surface on a side farther from the conductor layer 12), and the second conductor pattern 16C2 is formed on a second main surface of the substrate 15 (on a main surface on a side closer to the conductor layer 12). The first conductor pattern 16C1 and the second conductor pattern 16C2 are electrically connected using a through-via 16C3.

The first conductor pattern 16C1 is a strip-shaped conductor pattern formed on the first main surface of the substrate 15, as in the strip-shaped conductor 16, and a tip part of the first conductor pattern 16C1 is arranged outside the guidewave region of the post-wall waveguide PW.

The second conductor pattern 16C2 is a strip-shaped conductor pattern formed on the second main surface of the substrate 15. A first tip part of the second conductor pattern 16C2 is arranged outside the waveguide region of the post-wall waveguide PW and is arranged so as to overlap a first tip part of the first conductor pattern 16C1 in a plan view. A strip-shaped part of the second conductor pattern 16C2 crosses the short wall 14c and the opening 121 in a plan view, and a second tip part of the second conductor pattern 16C2 is arranged in the vicinity of the opening 121 in a plan view and is arranged in the waveguide region. Thus, in the mode converter 10C, a portion of the opening 121 in the vicinity of the center of the opening 121 and a portion of the strip conductor 16C overlap each other in a plan view of the post-wall waveguide PW. In the strip-shaped conductor 16C as well, the length of a portion of the second tip part of the second conductor pattern 16C2 which portion protrudes from the opening 121 is referred to as a length L3.

The through-via 16C3 is constituted by a cylindrical or columnar conductor (cylindrical conductor in the present embodiment) formed in a region which is outside the waveguide region in a plan view and in which a first tip part of the first conductor pattern 16C1 overlaps a first tip part of the second conductor pattern 16C2. In the present variation, the diameter of the through-via 16C3 is 300 μm.

In the mode converter 10, the strip-shaped conductor 16 is realized by using a single conductor pattern formed only on the first main surface of the substrate 15. However, as in the mode converter 10C, the strip-shaped conductor 16C may be such that the first conductor pattern 16C1 and the second conductor pattern 16C2 are formed on the first main surface of the substrate 15 and on the second main surface thereof, respectively, and are electrically connected to each other by using the through-via 16C3. In this case, the first conductor pattern 16C1 and the conductor layer 17 form a microstrip line, and the second conductor pattern 16C2 and the conductor layer 12 form a microstrip line. In the present variation, by appropriately designing the thickness TS of the solder 18C, it is possible to adjust the degree of coupling between the second conductor pattern 16C2 and the conductor layer 12 in the microstrip line MS.

Further, in an aspect of the present invention, a strip-shaped conductor corresponding to the strip-shaped conductor 16 may be formed on the second main surface of the substrate 15, not on the first main surface of the substrate 15. In this case, by joining at least a region in which the strip-shaped conductor and the conductor layer 12 face each other with use of the adhesive 18A having no conductivity, it is possible to prevent the strip-shaped conductor and the conductor layer 12 from being short-circuited. In this case, the strip-shaped conductor and the conductor layer 12 form a microstrip line.

Embodiment 2

Figure 6:
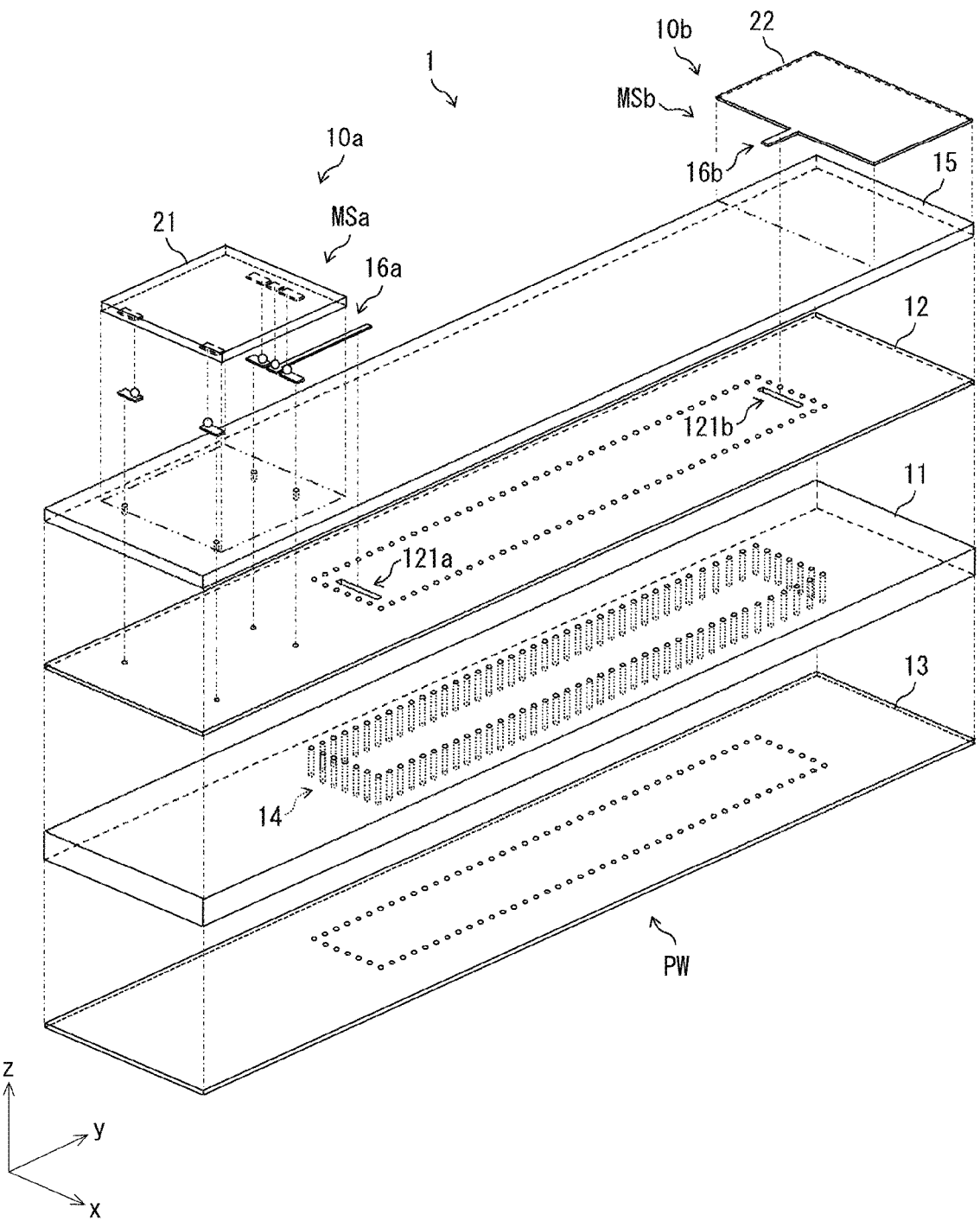
FIG. 6 is an exploded perspective view illustrating an RF module in accordance with Embodiment 2 of the present invention.
Figure 7:
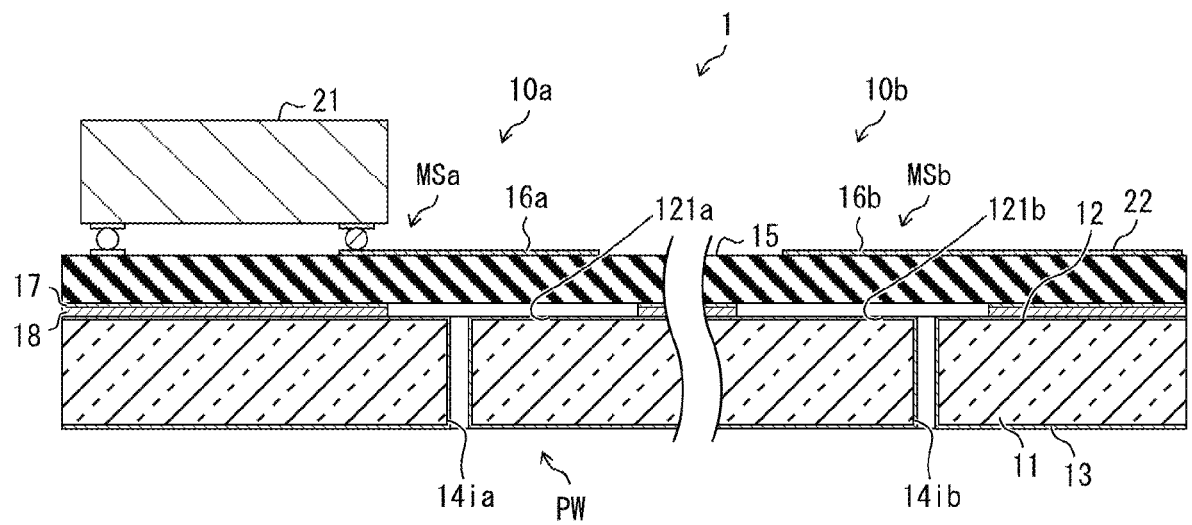
FIG. 7 is a cross-sectional view illustrating the RF module illustrated in FIG. 6.

The following description will discuss an RF module 1 in accordance with Embodiment 2 of the present invention with reference to FIGS. 6 and 7. FIG. 6 is an exploded perspective view of the RF module 1. Note that in FIG. 6, the conductor layer 17 and the solder 18 are not illustrated. FIG. 7 is a cross-sectional view illustrating the RF module 1 in a cross section passing through a straight line that coincides with central axes of strip-shaped conductors 16a and 16b (described later). For convenience of description, members having functions identical to those described in Embodiment are assigned identical referential numerals, and their descriptions are not repeated.

As illustrated in FIGS. 6 and 7, a mode converter 10a, a mode converter 10b, an RFIC 21, and an antenna 22 are provided. Each of the mode converters 10a and 10b is a specific example of the mode converter 10 illustrated in FIGS. 1 and 2 and is configured in the same manner as the mode converter 10. Members constituting the mode converter 10a are given reference numerals that are made up of the reference numerals of the members constituting the mode converter 10 and the suffix "a", and members constituting the mode converter 10b are given reference numerals that are made up of the reference numerals of the members constituting the mode converter 10 and the suffix "b". Note that a strip-shaped conductor 16a is an aspect of a first strip-shaped conductor, and a strip-shaped conductor 16b is an aspect of a second strip-shaped conductor.

The RF module 1 is obtained by (1) forming the mode converters 10a and 10b, which function as an input port and an output port, respectively, in the vicinity of the pair of short walls of the post-wall waveguide PW, (2) mounting the RFIC 21 on the strip-shaped conductor 16a of the mode converter 10a, and (3) mounting the antenna 22 on the strip-shaped conductor 16b of the mode converter 10b. The RF module 1 is an RF module in which the RFIC 21 and the antenna 22 are mounted on a first main surface of the substrate 15 (on a main surface on a side farther from the conductor layer 12), and a second main surface of the substrate 15 is mounted on a first main surface of the post-wall waveguide PW (on a surface of the conductor layer 12).

In the present embodiment, the following description will discuss only a configuration which has not been discussed above about the mode converter 10, of the configurations of the mode converters 10a and 10b. Specifically, the following description will discuss only, out of the tip parts of the strip-shaped conductor 16a, a second tip part (a tip part on a side farther from the opening 121a) on a side opposite the first tip part that protrudes from the opening 121a, and out of the tip parts of the strip-shaped conductor 16b, a second tip part (a tip part on a side farther from the opening 121b) on a side opposite the first tip part that protrudes from the opening 121b.

In the second tip part of the strip-shaped conductor 16a, a strip-shaped part of the strip-shaped conductor 16a is connected to a signal conductor pad, which is wider than the strip-shaped part, for connecting to a signal terminal of the RFIC 21. Further, on both sides of the signal conductor pad, two ground conductor pads for connecting to a ground terminal of the RFIC 21 are formed so as to sandwich the signal conductor pad therebetween. Each of the ground conductor pads is short-circuited to the conductor layer 12. As described above, in the vicinity of the second tip part of the strip-shaped conductor 16a, is formed a terminal which is for mounting the RFIC 21 and which has a GSG arrangement in which the conductor pads are arranged in the order of a ground conductor pad, a signal conductor pad, and a ground conductor pad. The RFIC 21 is mounted on the terminal of this GSG arrangement using bumps.

The antenna 22 is mounted on (connected to) the second tip part of the strip-shaped conductor 16b. Note that in the present embodiment, an aspect of the antenna 22 is not limited, and can be appropriately selected from among antennas capable of constituting a radiating element using a conductor pattern. Thus, in FIGS. 6 and 7, any specific shape of the antenna 22 is not illustrated. As the antenna 22, a patch antenna having a plurality of radiating elements each of which is constituted by a conductor pattern is suitable. In the present embodiment, the strip-shaped conductor 16b and the antenna 22 are realized as a single conductor pattern. The strip-shaped conductor 16b functions as a feed line.

As discussed above, the RF module 1 includes: the post-wall waveguide PW in which the opening 121a, which is a first opening, is provided in the vicinity of a first short wall, which is one of the short walls of the conductor layer 12, and the opening 121b, which is a second opening, is provided in the vicinity of a second short wall, which is the other short wall of the conductor layer 12; the dielectric substrate 15 having the first main surface on which the strip-shaped conductor 16a and the antenna, which uses the strip-shaped conductor 16a as a feed line, are formed; the solder 18, which is a joining member, joining the conductor layer 12 and the conductor layer 17 formed on the second main surface of the substrate 15 in a state in which the conductor layer 12 and the second main surface of the substrate 15 are parallel to or substantially parallel to each other; and the RFIC 21 being mounted on the first main surface of the substrate 15 and having terminals any of which is connected to a signal conductor pad which is connected to the second tip part of the strip-shaped conductor 16a. In the RF module 1, in a plan view of the post-wall waveguide PW, a portion of the opening 121a and a portion of the strip-shaped conductor 16a overlap each other, and a portion of the opening 121b and a portion of the strip-shaped conductor 16b overlap each other.

The RF module 1 functions as any of a transmission module, a reception module, and a transmission/reception module, depending on the functions of the RFIC 21 and the antenna 22.

Further, an aspect of the present invention includes a mobile terminal that is provided with the RF module 1. The RF module 1, which includes the microstrip lines MSa and MSb, the mode converters 10a and 10b, and the post-wall waveguide PW can suppress a transmission loss in a 28 GHz band as an operating band, and thus can be suitably used as an RF module for 5G.

Note that in the present embodiment, the configuration of the mode converter 10 is employed as the two mode converters provided in the RF module 1. However, the configuration of the two mode converters provided in the RF module 1 is not limited to the configuration of the mode converter 10, and may be any of the configurations discussed in the variations, or may be a configuration obtained by appropriately combining the configurations discussed in Embodiment 1 and/or the configurations discussed in the variations.

EXAMPLES

Example 1

Figure 8:
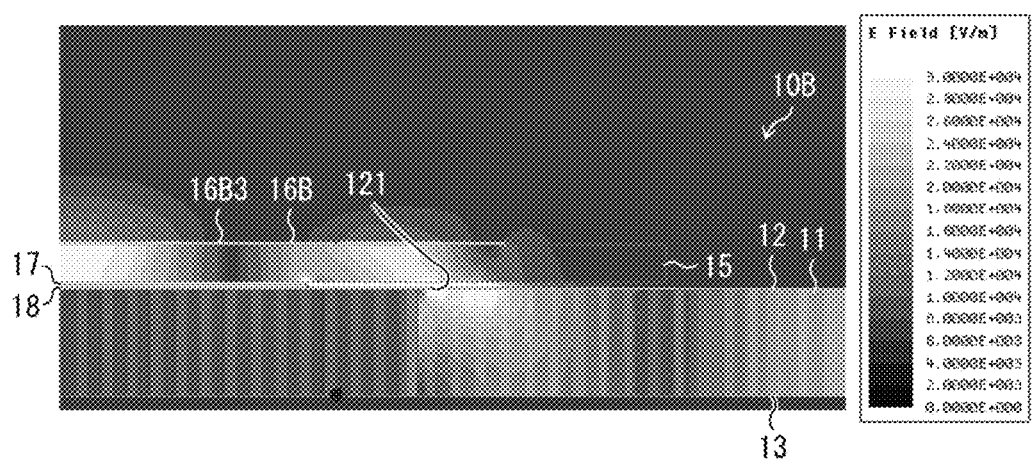
FIG. 8 is a cross-sectional view illustrating a mode converter showing results of simulation of a conversion characteristic of the mode converter in accordance with Example 1 of the present invention.
Figure 9:
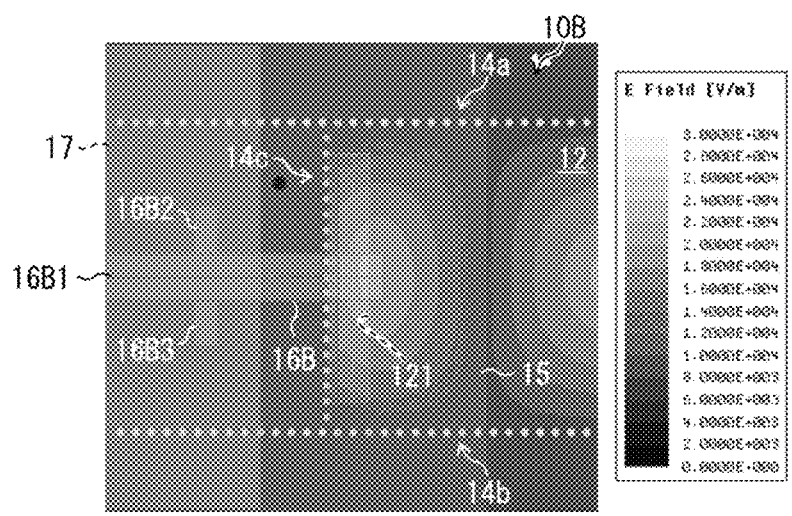
FIG. 9 is a plan view illustrating a mode converter showing results of simulation of a conversion characteristic of the mode converter in accordance with Example 1 of the present invention.
Figure 10:
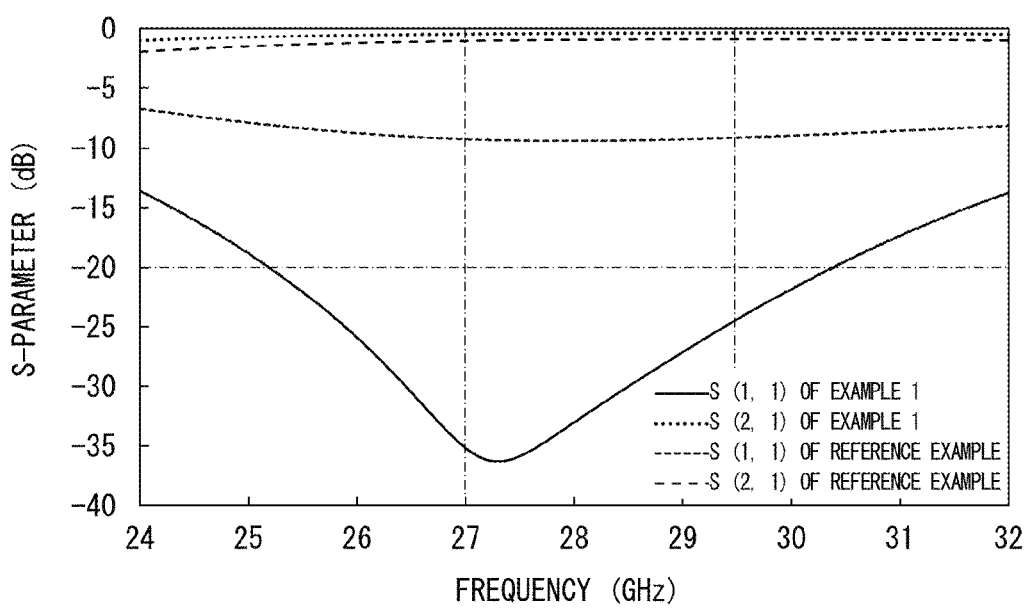
FIG. 10 is a graph showing respective reflection characteristics and respective transmission characteristics of mode converters in accordance with Example 1 and Reference Example of the present invention.
Figure 11:
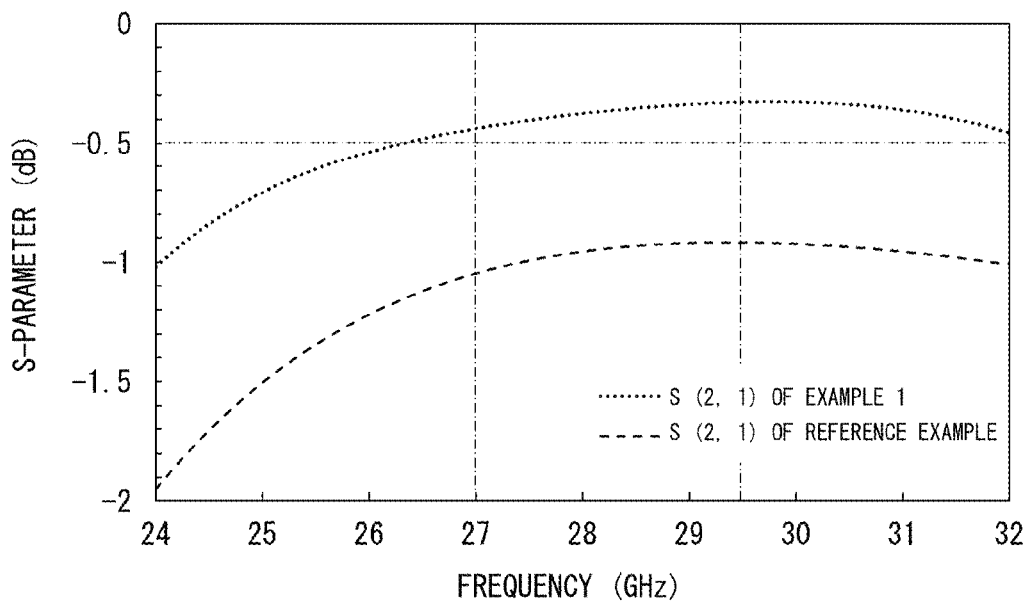
FIG. 11 is an enlarged graph showing respective transmission characteristics of the mode converters in accordance with Example 1 and Reference Example of the present invention.

The following description will discuss Example of the mode converter 10B illustrated in FIG. 4, which is Example 1 of the present invention, with reference to FIGS. 8 to 11. FIGS. 8 and 9 are a cross-sectional view and a plan view, respectively, illustrating the mode converter 10B showing results of simulation of a conversion characteristic of the mode converter 10B of Example 1. FIG. 10 is a graph showing respective reflection characteristics and respective transmission characteristics of the mode converter 10B of Example 1 and a mode converter of Reference Example. FIG. 11 is an enlarged graph showing respective transmission characteristics of the mode converter 10B of Example 1 and the mode converter of Reference Example. Note that the reflection characteristic means a frequency dependency of S-parameter S (1, 1), and the transmission characteristic means a frequency dependency of S-parameter S (2, 1). The same applies to Examples discussed later.

The mode converter 10B of Example 1 employed the following design parameters, with the aim of realizing an operating band including a 28 GHz band in the mode converter 10B illustrated in FIG. 4. In the present specification, a band of not less than 27 GHz and not more than 29.5 GHz is an operating band, and a mode converter is deemed to have excellent performance if the S-parameter S (1, 1) is below −20 dB and the S-parameter S (2, 1) is above −0.5 dB. The same applies to Examples discussed later, wherein the band of not less than 27 GHz and not more than 29.5 GHz is an operating band. Note that, of dot-and-dash lines shown in FIGS. 10 and 11, dot-and-dash lines parallel to a y-axis indicate 27 GHz and 29.5 GHz. Further, of the dot-and-dash lines shown in FIG. 10, a dot-and-dash line parallel to an x-axis indicates −20 dB, and, of the dot-and-dash lines shown in FIG. 11, a dot-and-dash line parallel to an x-axis indicates −0.5 dB.

(Design parameters)
Substrate 11: Made of quartz (T11=0.86 mm)
Post-wall waveguide PW: W1=4 mm
Substrate 15: Megtron6 (registered trademark) (T15=300 μm)
Conductor layers 12, 13, and 17: made of copper (thickness of 18 μm)
Opening 121: L2=3.2 mm, W2=400 μm, D1=100 μm, D2=D3=850 μm
Strip-shaped conductor 16B: made of copper (thickness of 18 μm), L3=200 μm, W3=600 μm
Stubs 16B1 and 16B2: shape of a rectangle having a long side of 600 μm in length and a short side of 300 μm in length
Solder 18: TS=30 μm Note that the mode converter of Reference Example is obtained by omitting the stubs 16B2 and 16B3 from the mode converter 10B of Example 1.

Referring to FIGS. 8 and 9, it was found that the mode converter 10B excellently converts between the quasi-TEM mode of the microstrip line MS and the TE mode of the post-wall waveguide PW through the opening 121.

Referring to FIGS. 10 and 11 for Reference Example, it was found that the reflection characteristic is above −20 dB in the entire band of not less than 24 GHz and not more than 32 GHz, and the transmission characteristic is below −0.5 GHz in the entire band of not less than 24 GHz and not more than 32 GHz. That is, it was found that the mode converter of Reference Example does not have excellent performance in the operating band of not less than 27 GHz and not more than 29.5 GHz.

On the other hand, in the mode converter 10B of Example 1 in which the stubs 16B2 and 16B3 are added to the strip-shaped conductor 16B, it was found that the S-parameter S (1, 1) is below −20 dB in the band of not less than 25.2 GHz and not more than 30.4 GHz as shown in FIG. 10, and the S-parameter S (2, 1) is above −0.5 dB in the band of not less than 26.3 GHZ and not more than 32 GHz as shown in FIG. 11. That is, it was found that the mode converter 10B of Example 1 has excellent performance in the operating band of not less than 27 GHz and not more than 29.5 GHz.

Examples 2 and 3

Figure 12:
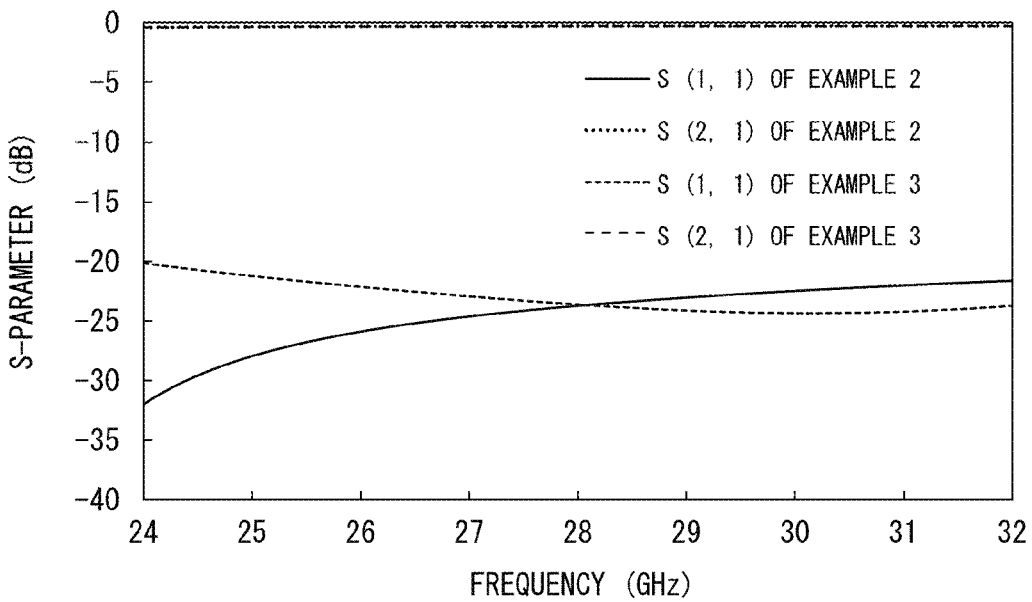
FIG. 12 is a graph showing a reflection characteristic and transmission characteristic of a mode converter in accordance with Example 2 of the present invention and a reflection characteristic and transmission characteristic of a mode converter in accordance with Example 3 of the present invention.
Figure 13:
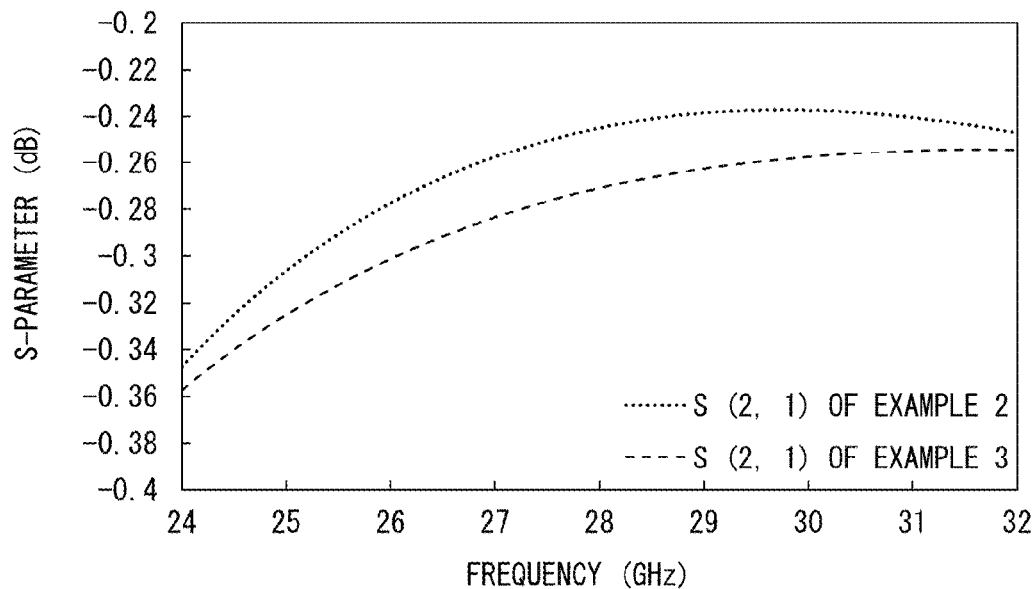
FIG. 13 is an enlarged graph showing a transmission characteristic of the mode converter in accordance with Example 2 of the present invention and a transmission characteristic of the mode converter in accordance with Example 3 of the present invention.

The following description will discuss Examples of the mode converters 10 illustrated in FIGS. 1 and 2, which are Examples 2 and 3 of the present invention, with reference to FIGS. 12 and 13. FIG. 12 is a graph showing respective reflection characteristics and respective transmission characteristics of the mode converter 10 of Example 2 and the mode converter 10 of Example 3. FIG. 13 is an enlarged graph showing a transmission characteristic of the mode converter 10 of Example 2 and a transmission characteristic of the mode converter 10 of Example 3.

The mode converter 10 of Example 2 employed the following design parameters.
(Design Parameters)
Substrate 11: Made of quartz (T11=0.86 mm)
Post-wall waveguide PW: W1=4 mm
Substrate 15: Megtron6 (registered trademark) (T15=300 μm)
Conductor layers 12, 13, and 17: made of copper (thickness of 18 μm)
Opening 121: L2=3.2 mm, W2=400 μm, D1=100 μm, D2=D3=850 μm
Strip-shaped conductor 16B: made of copper (thickness of 18 μm), L3=600 μm, W3=600 μm
Solder 18: TS=30 μm Further, the mode converter 10 of Example 3 was based on the mode converter 10 of Example 2 and was obtained by changing the thickness T15 of the substrate 15 from 300 μm to 100 μm and changing the thickness TS of the solder 18 to TS=150 μm.

Referring to FIGS. 12 and 13 for Example 2, it was found that the reflection characteristic is below −20 dB in the entire band of not less than 24 GHz and not more than 32 GHZ, and the transmission characteristic is above −0.5 dB in the entire band of not less than 24 GHz and not more than 32 GHz. That is, it was found that Example 2 has excellent performance in the operating band of not less than 27 GHz and not more than 29.5 GHz.

Referring to FIGS. 12 and 13 for Example 3, it was found that the reflection characteristic is below −20 dB in the entire band of not less than 24 GHz and not more than 32 GHZ, and the transmission characteristic is above −0.5 dB in the entire band of not less than 24 GHz and not more than 32 GHz. That is, it was found that Example 3 has excellent performance in the operating band of not less than 27 GHz and not more than 29.5 GHz.

Example Group 4

Figure 14:
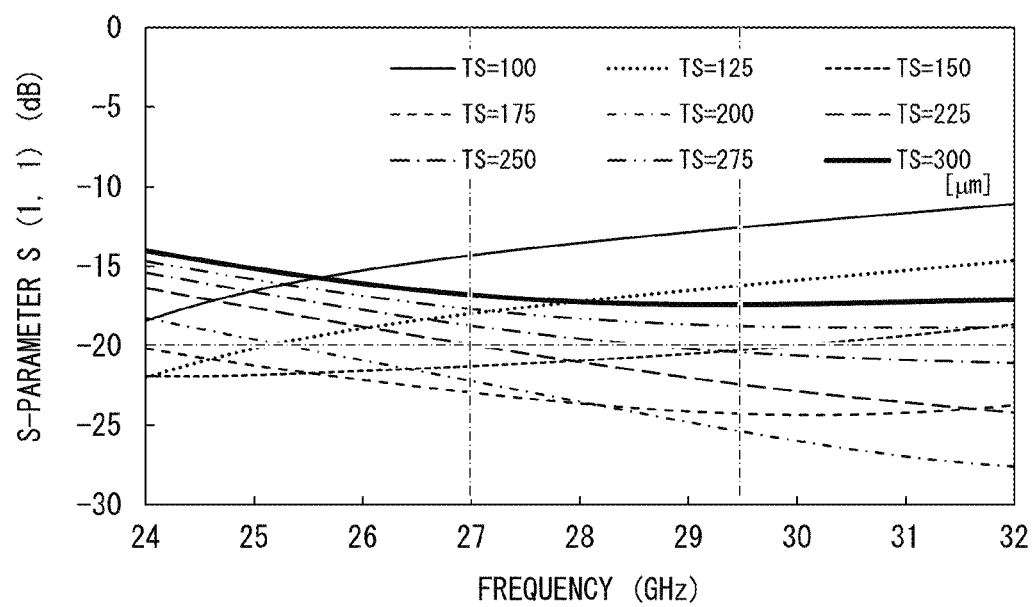
FIG. 14 is a graph showing a reflection characteristic of a mode converter in accordance with Example Group 4 of the present invention.
Figure 15:
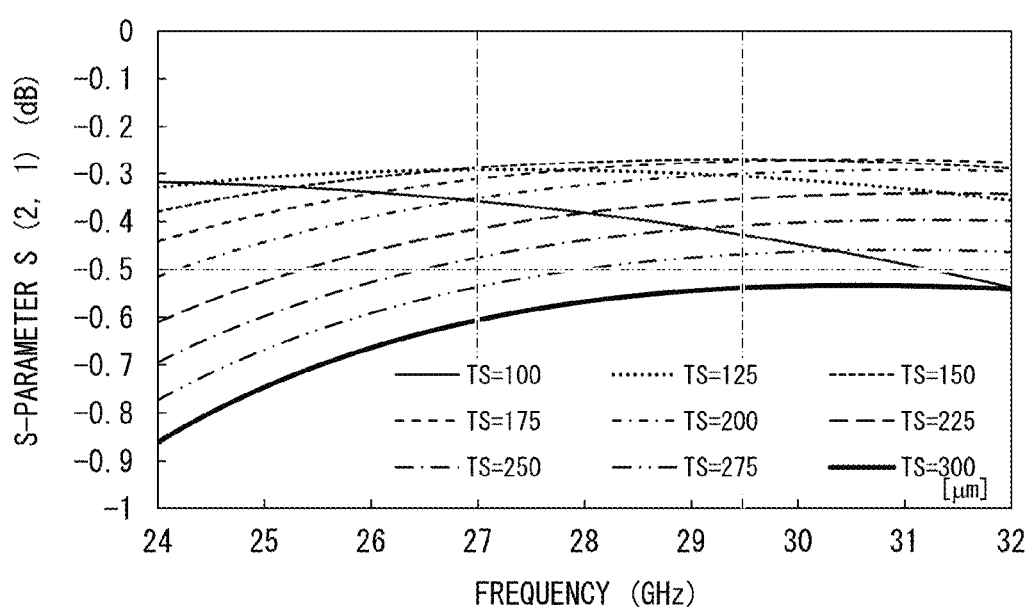
FIG. 15 is a graph showing transmission characteristics of the mode converter in accordance with Example Group 4 of the present invention.
Figure 16:
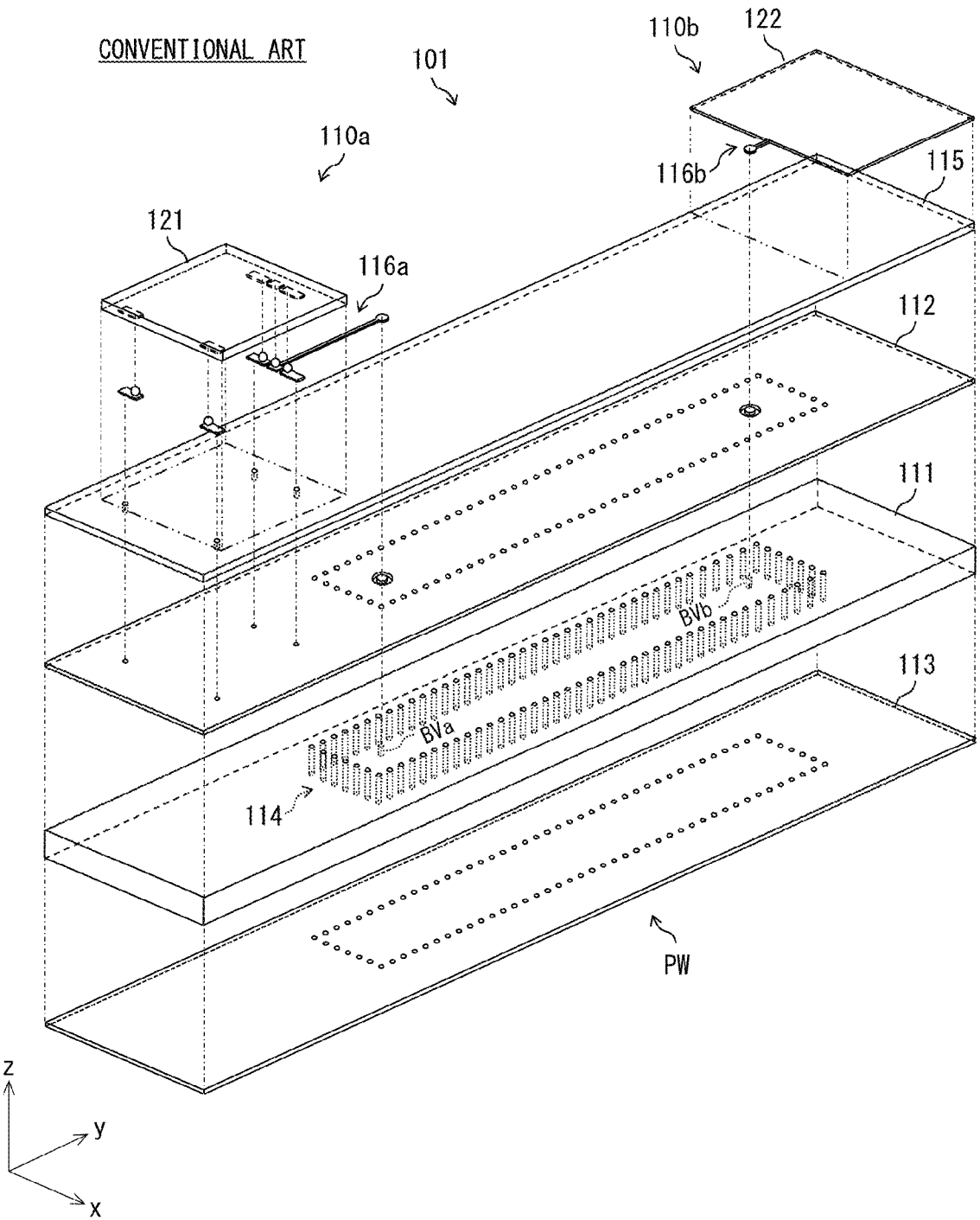
FIG. 16 is an exploded perspective view illustrating an RF module including the conventional mode converter.
Figure 17:
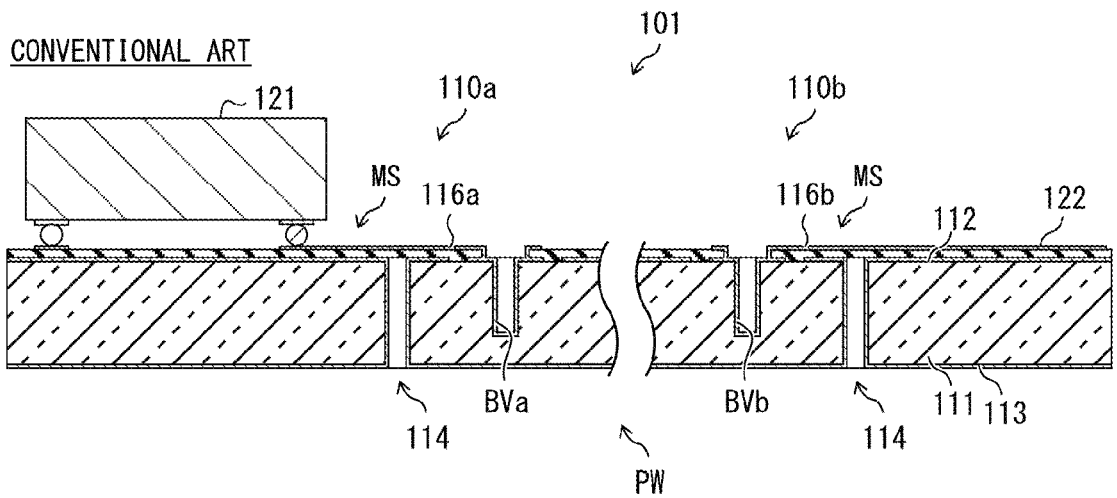
FIG. 17 is a cross-sectional view illustrating the RF module including the conventional mode converter.
Figure 18:
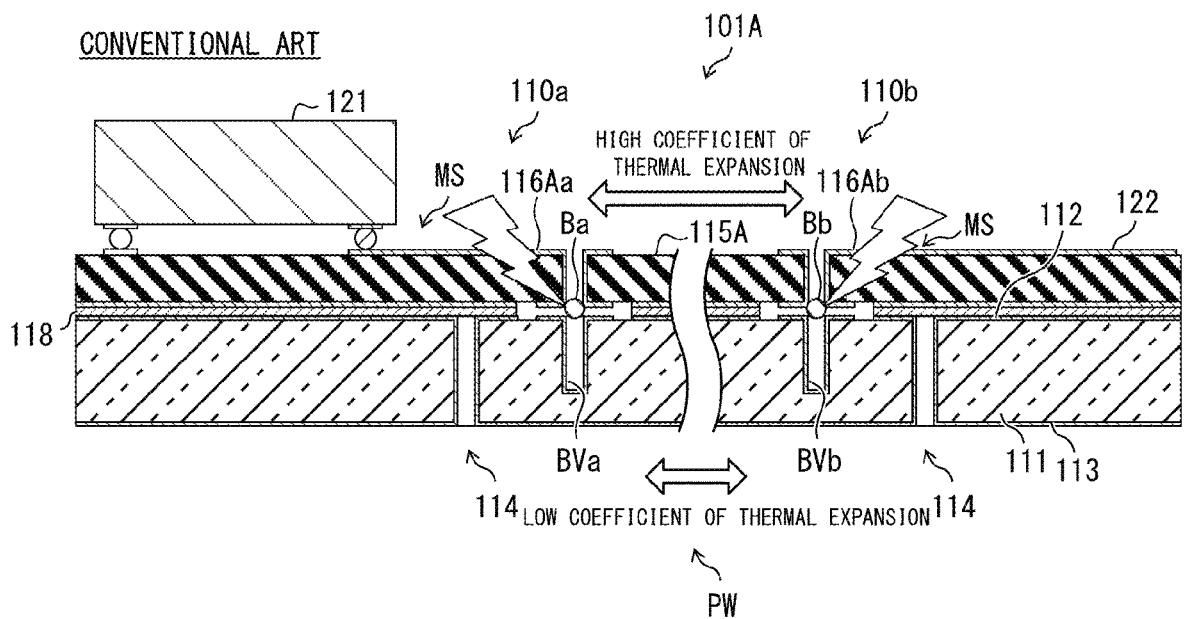
FIG. 18 is a cross-sectional view illustrating an RF module that includes the conventional mode converter and is in a form which differs from the form of the RF module illustrated in FIG. 17.

The following description will discuss Example Group 4 of the present invention, which is an example group of the mode converters 10 illustrated in FIGS. 1 and 2, with reference to FIGS. 14 and 15. FIG. 14 is a graph showing respective reflection characteristics of the mode converters 10 of Example Group 4. FIG. 15 is a graph showing respective transmission characteristics of the mode converters 10 of Example Group 4.

The mode converters 10 in Example Group 4 are based on the mode converter 10 of Example 3 as discussed above and are obtained by changing the thickness TS in the range of not less than 100 μm and not more than 300 μm. Thus, of the plots shown in FIGS. 14 and 15, the plots of TS=150 μm are the same as the plots of Example 3 shown in FIGS. 12 and 13.

For Example Group 4, referring to FIG. 14, the mode converter 10 such that the S-parameter S (1, 1) is below −20 dB in the band of not less than 27 GHz and not more than 29.5 GHz was the mode converter 10 having the thickness TS of not less than 150 μm and not more than 225 μm.

Further, for Example Group 4, referring to FIG. 15, the mode converter 10 such that the S-parameter S (2, 1) is above −0.5 dB in the band of not less than 27 GHz and not more than 29.5 GHz was the mode converter 10 having the thickness TS of not less than 100 μm and not more than 250 μm.

From the above results, it was found that in Example Group 4, the mode converter 10 having the thickness TS of not less than 150 μm and not more than 225 μm has excellent performance in the operating band of not less than 27 GHz and not more than 29.5 GHz.

Example 5

Figure 19:
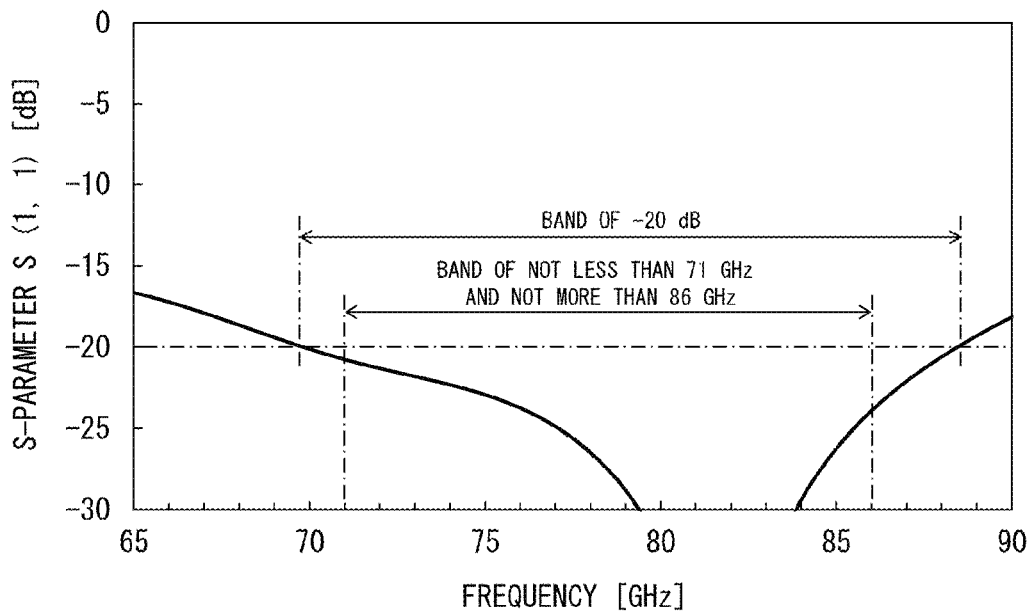
FIG. 19 is a graph showing a reflection characteristic of a mode converter in accordance with Example 5 of the present invention.
Figure 20:
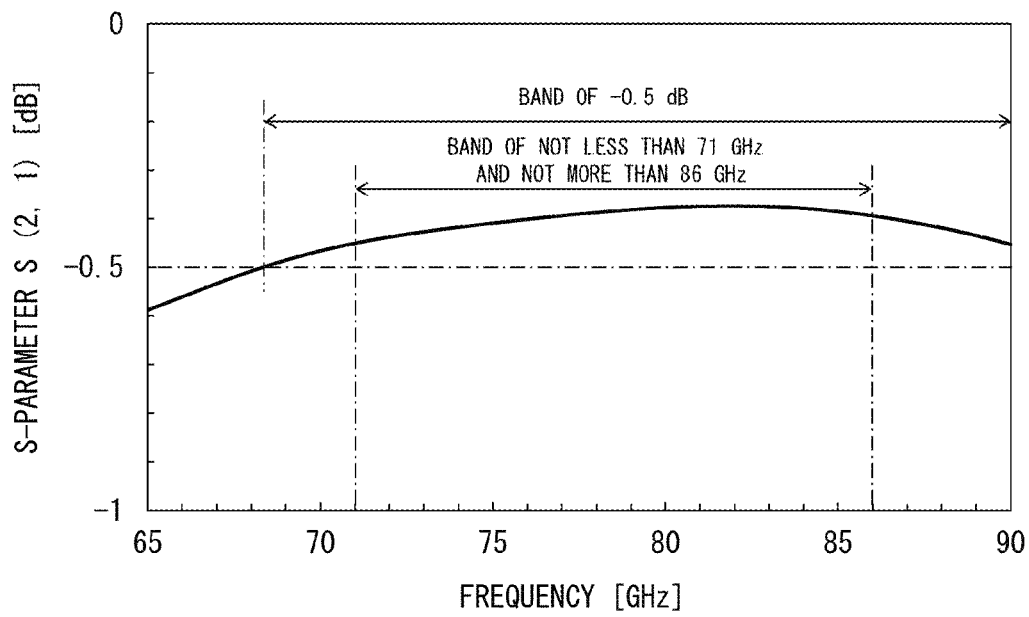
FIG. 20 is a graph showing a transmission characteristic of the mode converter in accordance with Example 5 of the present invention.

The following description will discuss Example of the mode converter 10 illustrated in FIGS. 1 and 2, which is Example 5 of the present invention, with reference to FIGS. 19 and 20. FIG. 19 and FIG. 20 are graphs respectively showing a reflection characteristic of a mode converter 10 of Example 5 and a transmission characteristic thereof.

The mode converter 10 of Example 5 employed the following design parameters, with the aim of setting a band called E-band of not less than 71 GHz and not more than 86 GHz as an operating band in the mode converter 10 illustrated in FIGS. 1 and 2. Specifically, in the mode converter 10 of Example 5, 59.62 GHz was employed as a cutoff frequency. Note that a guide wavelength at 77.5 GHz, which is 1.5 times the cutoff frequency, is 3.1 mm.

Note that, as discussed earlier, in the present specification, the E-band is an operating band, and a mode converter is deemed to have excellent performance if the S-parameter S (1, 1) is below −20 dB and the S-parameter S (2, 1) is above −0.5 dB. The same applies to Examples discussed later, wherein the E-band is an operating band. Note that, of dot-and-dash lines shown in FIGS. 19 and 20, dot-and-dash lines parallel to a y-axis indicate 71 GHz and 86 GHz. Further, of the dot-and-dash lines shown in FIG. 19, a dot-and-dash line parallel to an x-axis indicates −20 dB, and, of the dot-and-dash lines shown in FIG. 20, a dot-and-dash line parallel to an x-axis indicates −0.5 dB.

(Design Parameters)
  Substrate 11: Made of quartz (T11=0.45 mm)
  Post-wall waveguide PW: W1=1.54 mm
  Substrate 15: Megtron6 (registered trademark) (T15=125 μm)
  Conductor layers 12 and 13: made of copper (thickness of 10 μm)
  Conductor layer 17: made of copper (thickness of 18 μm)
  Opening 121: L2=1.4 mm, W2=150 μm, D1=75 μm, D2=D3=375 μm
  Strip-shaped conductor 16B: made of copper (thickness of 20 μm), L3=275 μm, W3=250 μm
  Solder 18: TS=30 μm In the mode converter 10 of Example 5, it was found that the S-parameter S (1, 1) is below −20 dB in the band of not less than 69.8 GHz and not more than 88.2 GHz as shown in FIG. 19, and the S-parameter S (2, 1) is above −0.5 dB in the band of not less than 68.4 GHz and not more than 90 GHz as shown in FIG. 20. That is, it was found that the mode converter 10B of Example 5 has excellent performance in the E-band which is the operating band.

Example Group 6

Figure 21:
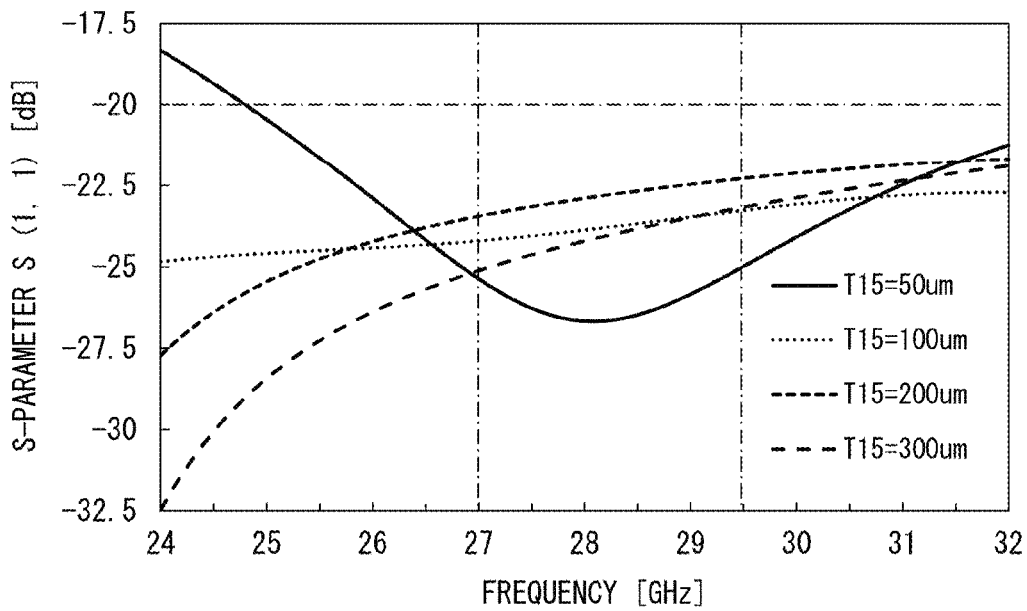
FIG. 21 is a graph showing a reflection characteristic of a mode converter in accordance with Example Group 6 of the present invention.
Figure 22:
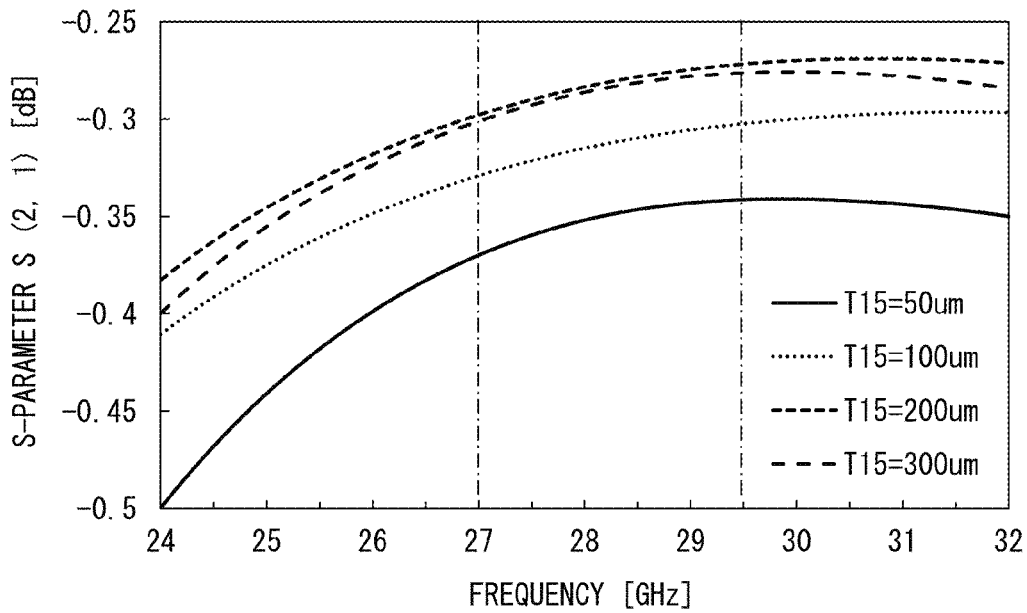
FIG. 22 is a graph showing a transmission characteristic of the mode converter in accordance with Example Group 6 of the present invention.

The following description will discuss Example Group 6 of the present invention, which is an example group of the mode converters 10 illustrated in FIGS. 1 and 2, with reference to FIGS. 21 and 22. FIG. 21 is a graph showing respective reflection characteristics of the mode converters 10 of Example Group 6. FIG. 22 is a graph showing respective transmission characteristics of the mode converters 10 of Example Group 6.

The mode converter 10 of Example Group 6 employed the following design parameters, with the aim of realizing an operating band including a 28 GHz band in the mode converter 10 illustrated in FIGS. 1 and 2. Specifically, in the mode converter 10 of Example Group 6, 19.68 GHz was employed as a cutoff frequency. Note that a guide wavelength at 28 GHz, which is 1.42 times the cutoff frequency, is 7.7 mm.

Note that, of dot-and-dash lines shown in FIGS. 21 and 22, dot-and-dash lines parallel to a y-axis indicate 27 GHz and 29.5 GHz. Further, of the dot-and-dash lines shown in FIG. 21, a dot-and-dash line parallel to an x-axis indicates −20 dB.

The mode converters 10 of Example Group 6 employed the following design parameters. The mode converters 10 of Example Group 6 are each obtained by changing the thickness T15 of the substrate 15 in a range of not less than 50 μm and not more than 300 μm. Further, with the change of the thickness T15 in the above range, the width W3 of the strip-shaped conductor 16 is changed so as to be twice the thickness T15. That is, in the mode converters 10 of Example Group 6, the width W3 is changed in a range of not less than 100 μm and not more than 600 μm. Thus, by determining the width W3 so that the width W3 is twice the thickness T15, an input impedance of the microstrip line MS can be set to approximately 50Ω.

(Design Parameters)
  Substrate 11: Made of quartz (T11=0.86 mm)
  Post-wall waveguide PW: W1=4 mm
  Substrate 15: Megtron6 (registered trademark) (T15=50 μm, 100 μm, 200 μm, and 300 μm)
  Conductor layers 12 and 13: made of copper (thickness of 10 μm)
  Conductor layer 17: made of copper (thickness of 18 μm)
  Opening 121: L2=3.2 mm, W2=400 μm, D1=100 μm, D2=D3=850 μm Strip-shaped conductor 16B: made of copper (thickness of 18 μm), L3=600 μm, W3=100 μm, 200 μm, 400 μm, and 600 μm Solder 18: TS=30 μm In each of the mode converters 10 in Example Group 6, it was found that the S-parameter S (1, 1) is below −20 dB in the operating band of not less than 27 GHz and not more than 29.5 GHz as shown in FIG. 21, and the S-parameter S (2, 1) is above −0.5 dB in the band of not less than 27 GHz and not more than 29.5 GHz as shown in FIG. 22. That is, it was found that each of the mode converters 10 of Example Group 6 has excellent performance in the above operating band.

<Fourth Variation>

Figure 23:
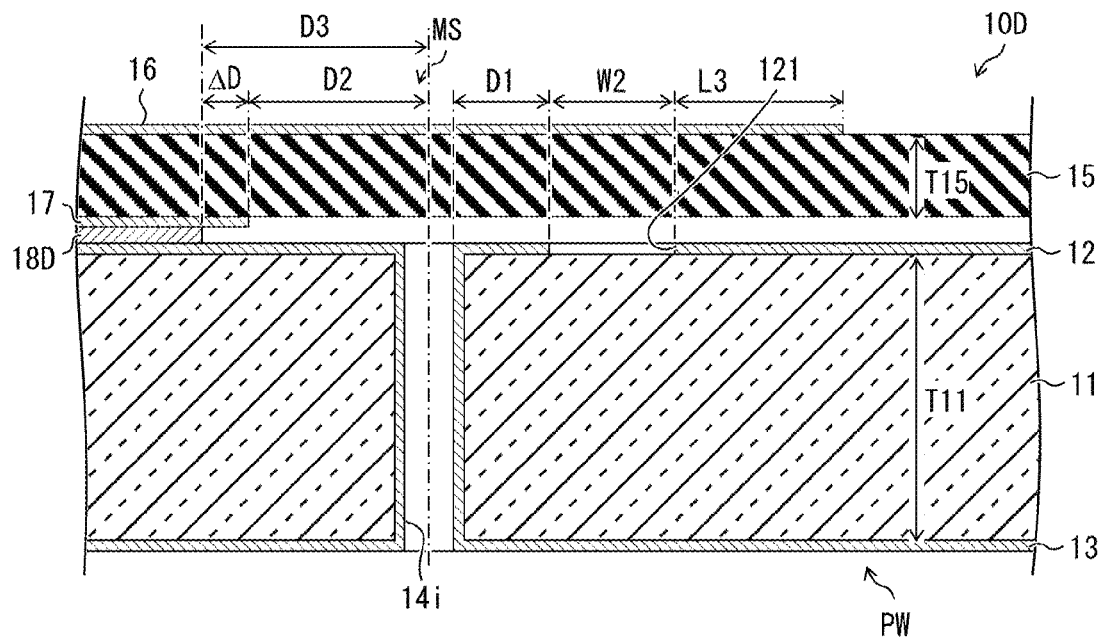
FIG. 23 is a cross-sectional view illustrating a fourth variation of the mode converter illustrated in FIG. 1.

The following description will discuss, with reference to FIG. 23, a mode converter 10D in accordance with Fourth Variation of the present invention, which is a variation of the mode converter 10 illustrated in FIGS. 1 and 2. FIG. 23 is a cross-sectional view illustrating the mode converter 10D.

The mode converter 10D is based on the mode converter 10 and is obtained by arranging such that the position of an edge of the conductor layer 17 on a side closer to the opening 121 out of edges of the conductor layer 17 is different from the position of an edge of a solder 18D, which corresponds to the solder 18, on a side closer to the opening 121 out of edges of the solder 18D. Note that in Fourth Variation as well, the shortest distance between the central axes of the through-vias 14i constituting the short wall 14c and the conductor layer 17 is referred to as a distance D2, and the shortest distance between the central axes of the through-vias 14i constituting the short wall 14c and the solder 18 is referred to as a distance D3. In the mode converter 10D illustrated in FIG. 23, the distance D2 and the distance D3 are determined so as to satisfy D3=D2+ΔD, that is, D3>D2, on the assumption that a difference ΔD is positive.

In an aspect of the present invention, the distance D2 and the distance D3 may differ from each other as in the mode converter 10D. Further, the description in Fourth Variation has discussed a case where the distance D2 and the distance D3 satisfy D3>D2. However, in an aspect of the mode converter 10D, the distance D2 and the distance D3 may be arranged so as to satisfy D3<D2.

Example Group 7

Figure 24:
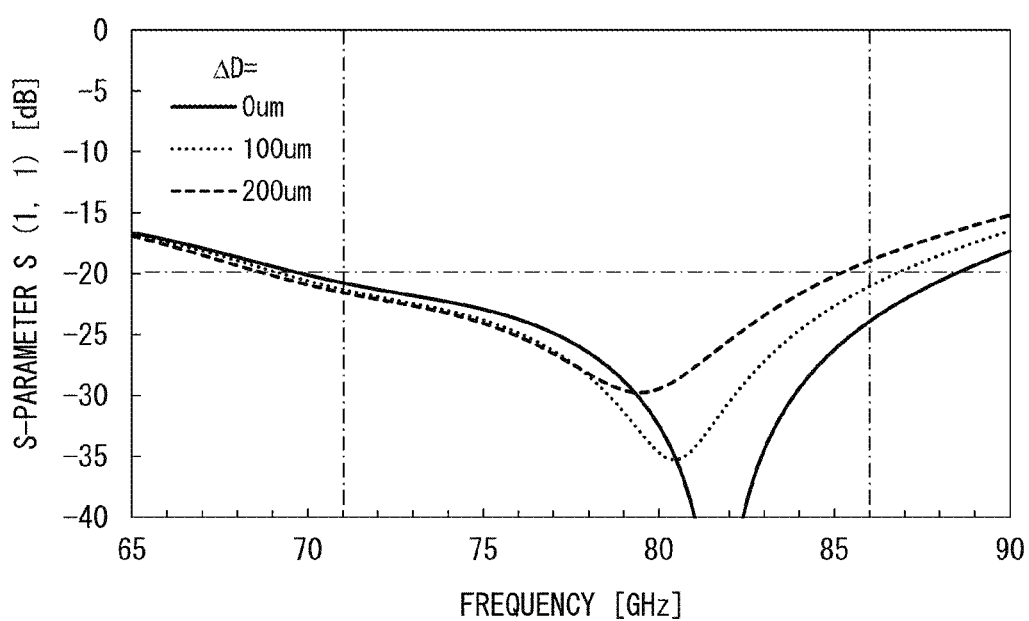
FIG. 24 is a graph showing respective reflection characteristics of the mode converters in accordance with Example Group 7 of the present invention.

The following description will discuss, with reference to FIG. 24, mode converters 10D in accordance with Example Group 7 of the present invention, which is an example group of Fourth Variation illustrated in FIG. 23. FIG. 24 is a graph showing respective reflection characteristics of the mode converters 10D of Example Group 7. Note that the mode converters 10D of Example Group 7 are designed with the aim of using the E-band as the operating band.

The mode converters 10D of Example Group 7 are based on the mode converter 10 of Example 5 and are obtained by employing, as the difference ΔD, ΔD=100 μm and 200 μm. Note that the plot of ΔD=0 μm shown in FIG. 24 is the reflection characteristic of the mode converter 10 of Example 5.

Referring to FIG. 24, it was found that the larger the difference ΔD, the narrower the bandwidth of the operating band. In other words, it is preferable that the difference ΔD is small in order to realize an operating band having as a wide bandwidth as possible.

Example Group 8

Figure 25:
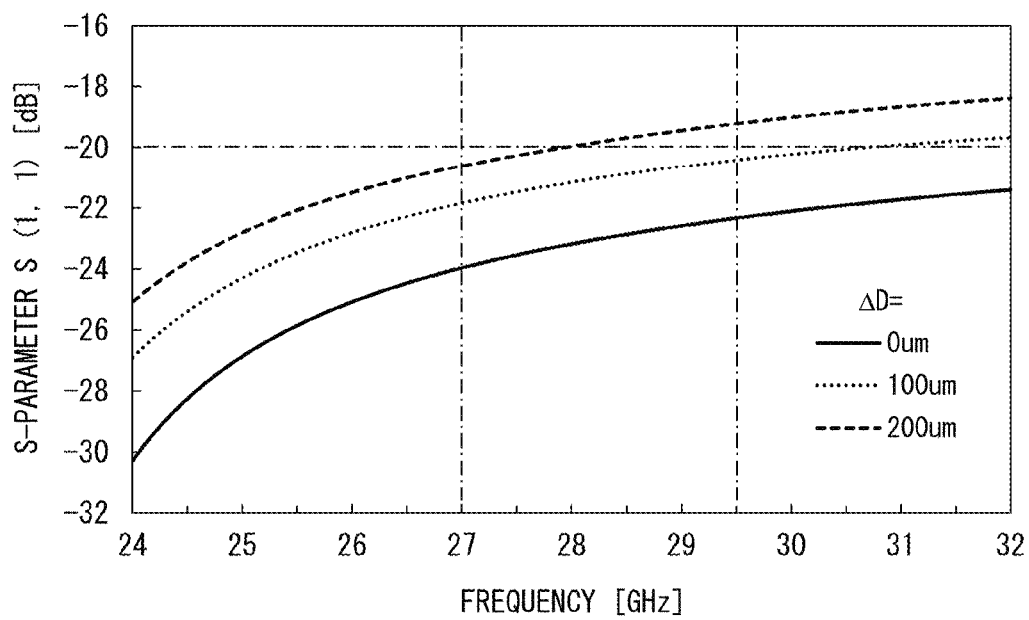
FIG. 25 is a graph showing respective reflection characteristics of the mode converters in accordance with Example Group 8 of the present invention.

The following description will discuss, with reference to FIG. 25, mode converters 10D in accordance with Example Group 8 of the present invention, which is an example group of Fourth Variation illustrated in FIG. 23. FIG. 25 is a graph showing a reflection characteristic of the mode converters 10D of Example Group 8. Note that the mode converters 10D of Example Group 8 are designed with the aim of realizing an operating band including a 28 GHz band.

The mode converters 10D of Example Group 8 are based on the mode converter 10 in which the thickness T15 of the substrate 15 is 300 μm among the mode converters 10 of Example Group 6, and are obtained by employing, as the difference ΔD, ΔD=100 μm and 200 μm.

Referring to FIG. 25, it was found that the larger the difference ΔD, the narrower the bandwidth of the operating band. In other words, it is preferable that the difference ΔD is small in order to realize an operating band having as a wide bandwidth as possible.

Example 9

Figure 26:
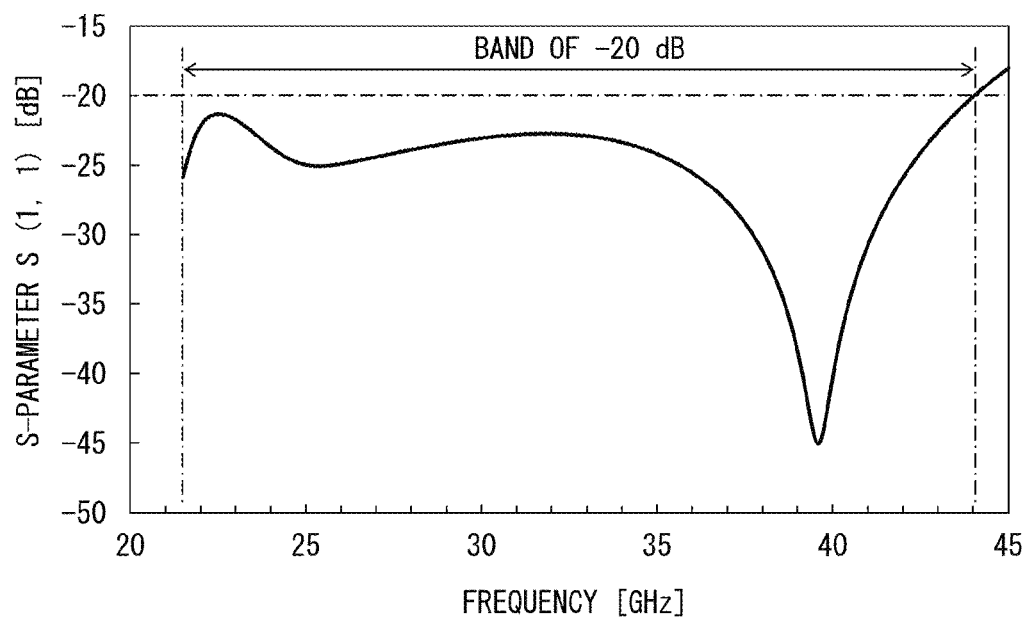
FIG. 26 is a graph showing a reflection characteristic of the mode converter in accordance with Example 9 of the present invention.
Figure 27:
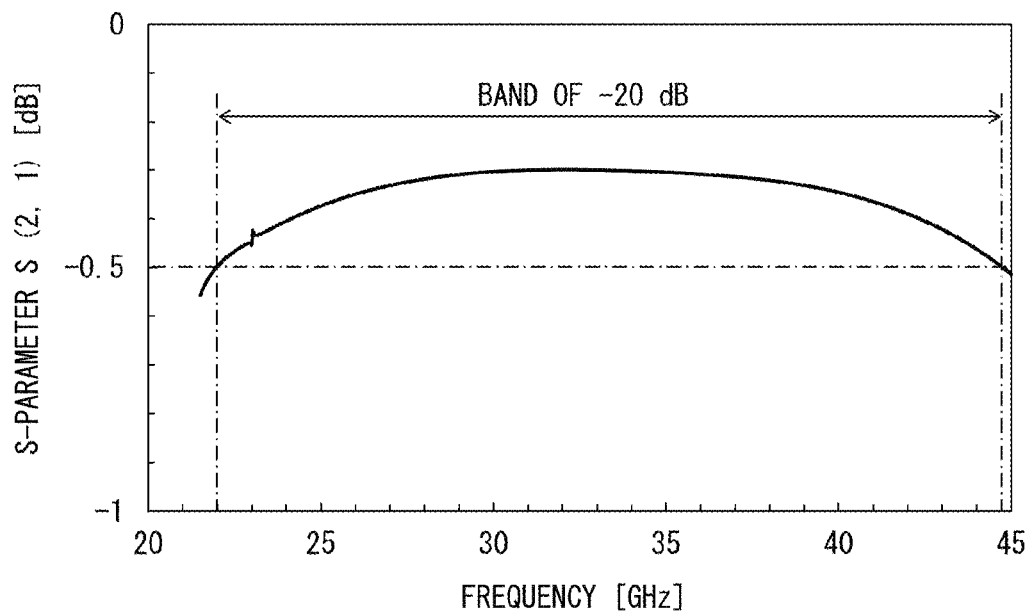
FIG. 27 is a graph showing a transmission characteristic of the mode converter in accordance with Example 9 of the present invention.

The following description will discuss Example of the mode converter 10 illustrated in FIGS. 1 and 2, which is Example 9 of the present invention, with reference to FIGS. 26 and 27. FIG. 26 is a graph showing a reflection characteristic of a mode converter 10 of Example 9. FIG. 27 is a graph showing a transmission characteristic of the mode converter 10 of Example 9.

The mode converter 10 of Example 9 employed the following design parameters, with the aim of realizing an operating band including a 32 GHz band and having as a wide bandwidth as possible in the mode converter 10 illustrated in FIGS. 1 and 2. Specifically, in the mode converter 10 of Example 9, 21.3 GHz was employed as a cutoff frequency. Note that a guide wavelength at 32 GHz, which is 1.5 times the cutoff frequency, is 9.38 mm.

(Design Parameters)

Substrate 11: Made of quartz (T11=0.86 mm)

Post-wall waveguide PW: W1=4 mm

Substrate 15: Megtron6 (registered trademark) (T15=100 μm)

Conductor layers 12 and 13: made of copper (thickness of 10 μm)

Conductor layer 17: made of copper (thickness of 20 μm)

Opening 121: L2=3.2 mm, W2=400 μm, D1=100 μm, D2=D3=850 μm

Strip-shaped conductor 16B: made of copper (thickness of 20 μm), L3=600 μm, W3=200 μm Solder 18: TS=30 μm In the mode converters 10 of Example 9, it was found that the S-parameter S (1, 1) is below −20 dB in the band of not less than 21.5 GHz and not more than 44 GHz as shown in FIG. 26, and the S-parameter S (2, 1) is above −0.5 dB in the band of not less than 22 GHz and not more than 44.8 GHz as shown in FIG. 27. That is, it was found that the mode converter 10 of Example 9 has excellent performance in the band of not less than 22 GHz and not more than 44 GHz.

<Fifth Variation>

Figure 28:
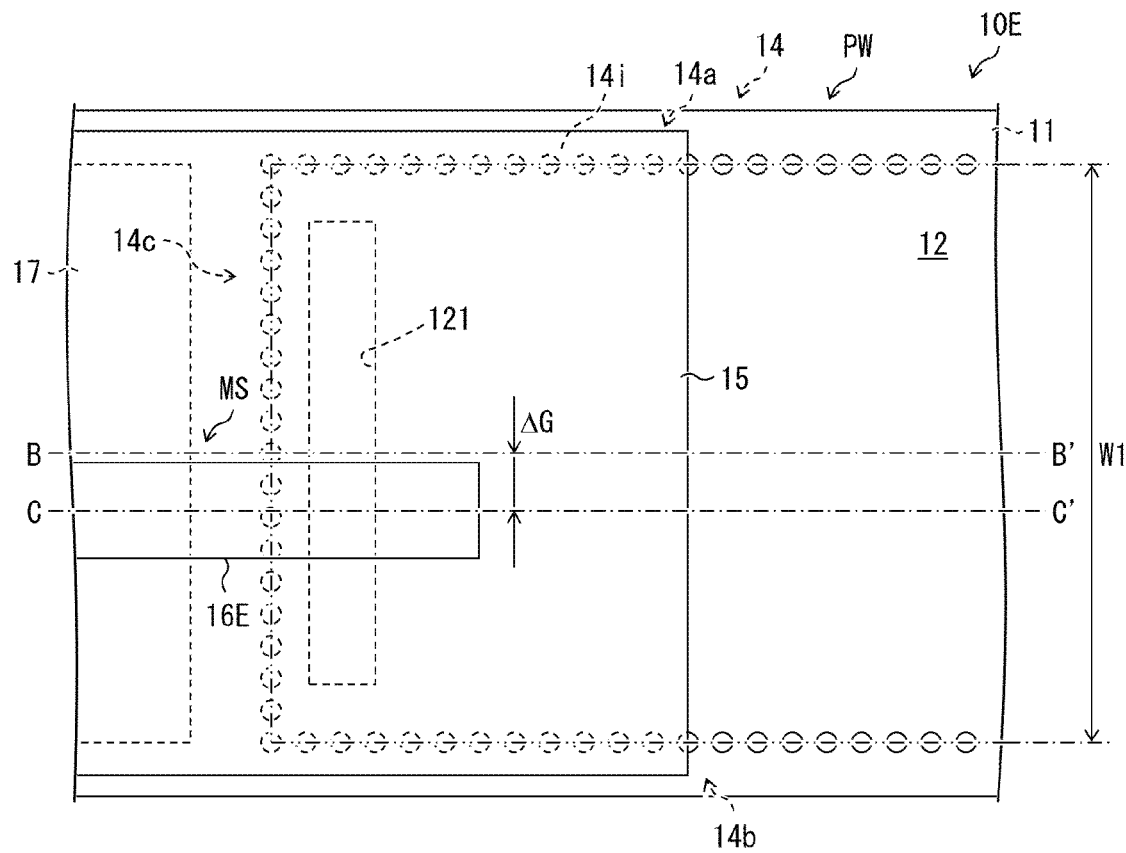
FIG. 28 is a plan view illustrating a fifth variation of the mode converter illustrated in FIG. 1.

The following description will discuss, with reference to FIG. 28, a mode converter 10E in accordance with Fifth Variation of the present invention, which is a variation of the mode converter 10 illustrated in FIGS. 1 and 2. FIG. 28 is a plan view illustrating the mode converter 10E.

The mode converter 10E is based on the mode converter 10 and is obtained by replacing the strip-shaped conductor 16 with a strip-shaped conductor 16E.

The strip-shaped conductor 16E is a rectangular conductor pattern formed in the same manner as the strip-shaped conductor 16. The strip-shaped conductor 16E is different in position on the first main surface of the substrate 15, as compared with the strip-shaped conductor 16. Specifically, in a plan view of the first main surface of the substrate 15, the strip-shaped conductor 16 is arranged such that the central axis of the strip-shaped conductor 16 coincides with a B-B' line, which is a straight line that is parallel to the lengthwise direction of the post-wall waveguide PW and that is a set of points equally dividing the width W1 of the post-wall waveguide PW. On the other hand, in a plan view of the first main surface of the substrate 15, the strip-shaped conductor 16E is arranged so as to be displaced in parallel by a gap ΔG from the B-B' line. In FIG. 28, a straight line that coincides with the central axis of the strip-shaped conductor 16E is indicated by a C-C' line.

In such a manner, the central axis of the strip-shaped conductor 16E can be provided so as to be displaced from the B-B' line, so that the mode converter 10E can increase the degree of freedom of the arrangement of the strip-shaped conductor 16E.

Example Group 10

Figure 29:
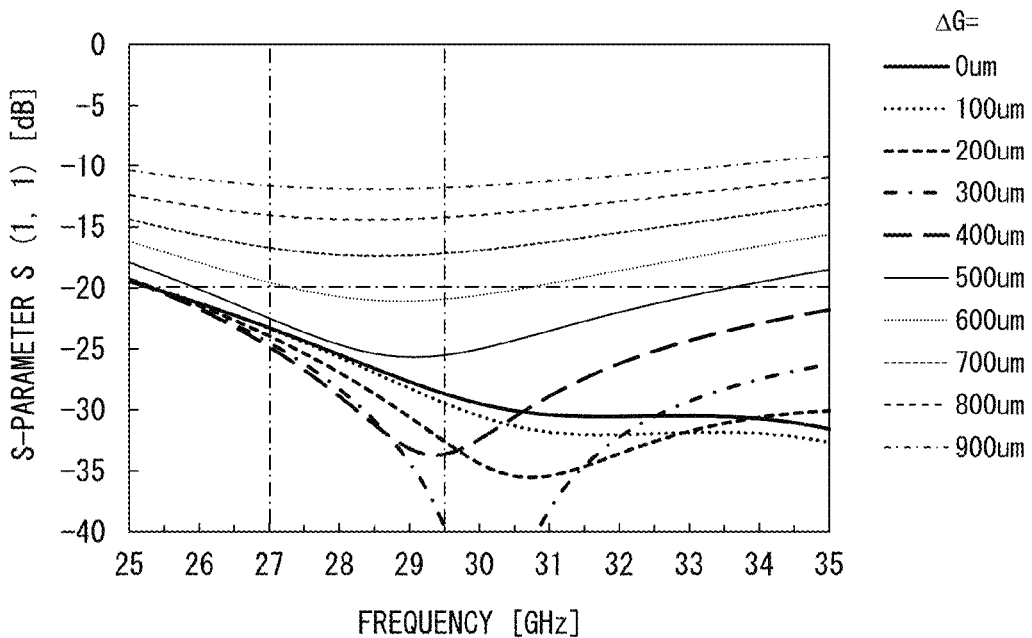
FIG. 29 is a graph showing respective reflection characteristics of the mode converters in accordance with Example Group 10 of the present invention.
Figure 30:
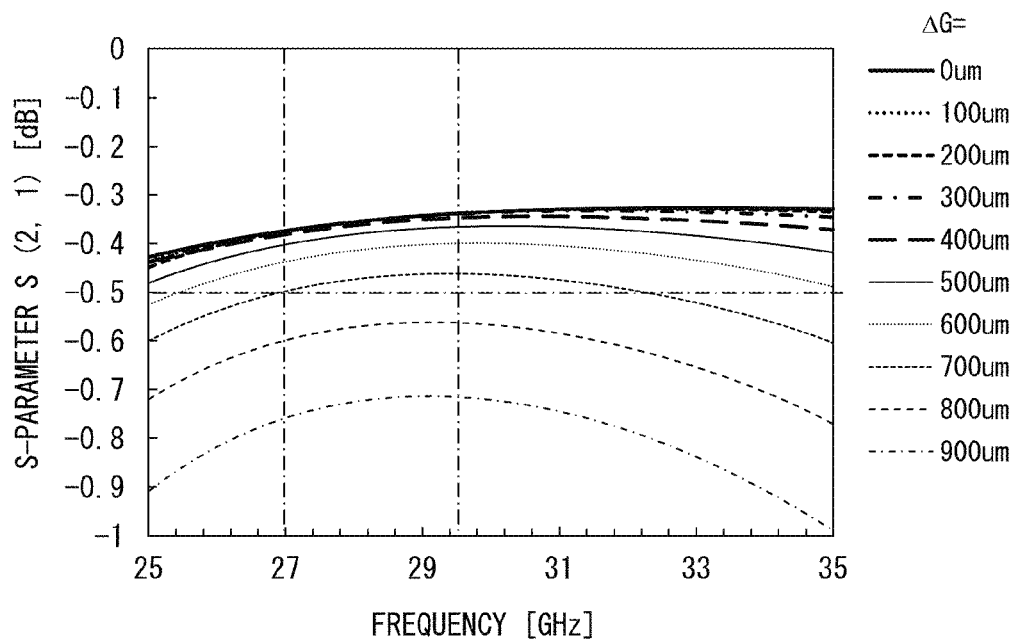
FIG. 30 is a graph showing respective transmission characteristics of the mode converters in accordance with Example Group 10 of the present invention.

The following description will discuss, with reference to FIGS. 29 and 30, mode converters 10E in accordance with Example Group 10 of the present invention, which is an example group of the mode converter 10E illustrated in FIG. 28. FIG. 29 is a graph showing respective reflection characteristics of the mode converters 10E of Example Group 10. FIG. 30 is a graph showing respective transmission characteristics of the mode converters 10E of Example Group 10.

The mode converters 10E of Example Group 10 employed the following design parameters, with the aim of realizing an operating band including a 28 GHz band in the mode converter 10E illustrated in FIG. 28. The mode converters 10E of Example Group 10 are obtained by changing the gap ΔG in a range of not less than 0 μm and not more than 900 μm.

(Design Parameters)
  Substrate 11: Made of quartz (T11=0.86 mm)
  Post-wall waveguide PW: W1=4 mm
  Substrate 15: Megtron6 (registered trademark) (T15=100 μm)
  Conductor layers 12 and 13: made of copper (thickness of 10 μm)
  Conductor layer 17: made of copper (thickness of 18 μm)
  Opening 121: L2=3.2 mm, W2=400 μm, D1=100 μm, D2=D3=850 μm
  Strip-shaped conductor 16B: made of copper (thickness of 18 μm), L3=600 μm, W3=200 μm, ΔG=0, 100, 200, 300, 400, 500, 600, 700, 800, 900 μm
  Solder 18: TS=30 μm Referring to FIG. 29, in the mode converter 10E of Example Group 10, it was found that (1) in a case where the gap ΔG is not less than 0 μm and not more than 500 μm, the S-parameter S (1, 1) is below −20 dB in the operating band of not less than 27 GHz and not more than 29.5 GHz, that (2) in a case where the gap ΔG is 600 μm, the S-parameter S (1, 1) is above −20 dB in a part of the above operating band, and that (3) in a case where the gap ΔG is not less than 700 μm and not more than 900 μm, the S-parameter S (1, 1) is above −20 dB in the above operating band.

Further, referring to FIG. 30, in the mode converter 10E of Example Group 10, it was found that (4) in a case where the gap ΔG is not less than 0 μm and not more than 800 μm, the S-parameter S (2, 1) is above −0.5 dB in the above operating band, and that (5) in a case where the gap ΔG is 900 μm, the S-parameter S (2, 1) is below −0.5 dB in the above operating band.

From the above results, it was found that it is preferable that the mode converters 10E of Example Group 10 employ, as the gap ΔG, a value included in the range of not less than 0 μm and not more than 500 μm, to exhibit excellent performance in the above operating band.

<Sixth Variation>

Figure 31:
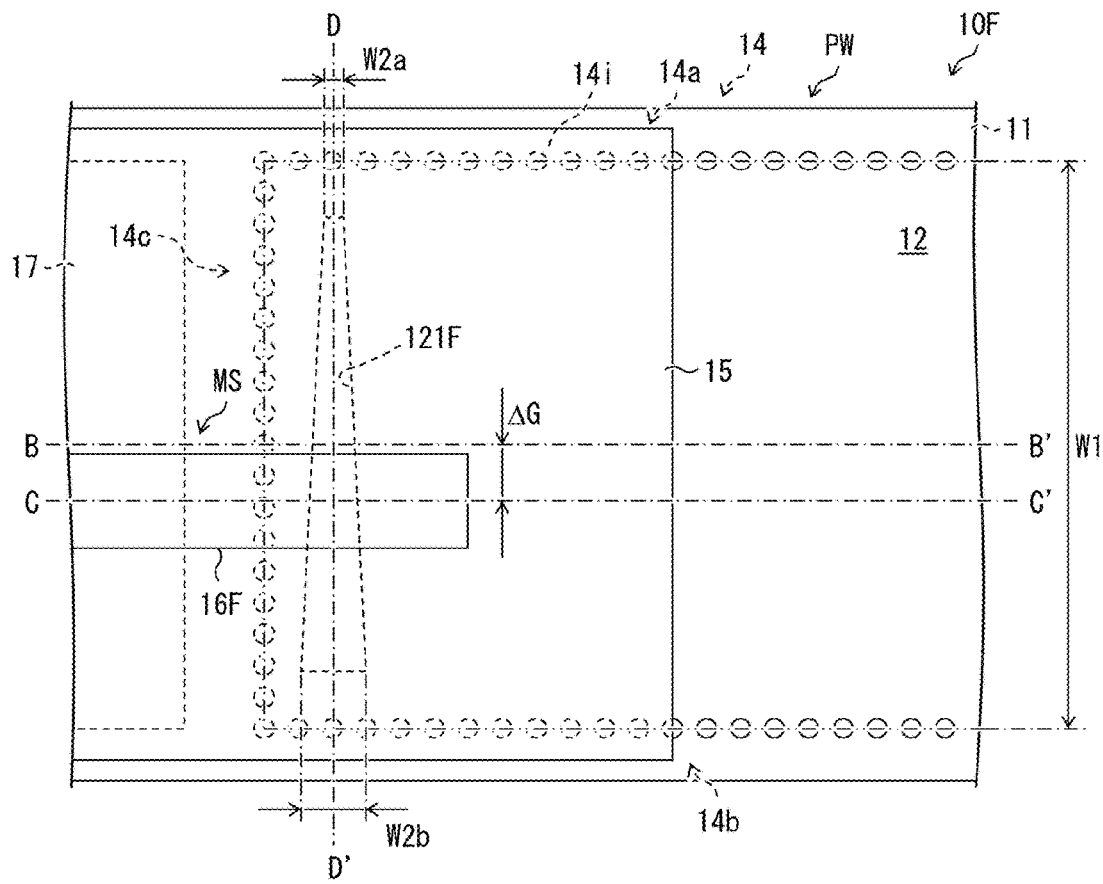
FIG. 31 is a plan view illustrating a sixth variation of the mode converter illustrated in FIG. 1.

The following description will discuss, with reference to FIG. 31, a mode converter 10F in accordance with Sixth Variation of the present invention, which is a variation of the mode converter 10E illustrated in FIG. 28. FIG. 31 is a plan view illustrating the mode converter 10F.

The mode converter 10F is based on the mode converter 10E and is obtained by replacing the opening 121 with an opening 121F. Note that the strip-shaped conductor 16F included in the mode converter 10F has the same configuration as the strip-shaped conductor 16E included in the mode converter 10E.

The opening 121F is an opening provided in the conductor layer 12 that constitutes a first wide wall of the post-wall waveguide PW, as with the opening 121, but the shape of the opening 121F differs from that of the opening 121. Specifically, in a plan view of the first main surface of the substrate 15, the opening 121 is in the shape of a rectangle having a long side parallel to the short wall 14c and a short side parallel to the narrow walls 14a and 14b. On the other hand, in the present variation, the opening 121F is in the shape of an isosceles trapezoid in which respective portions of a pair of short sides of the opening 121 correspond to a pair of bases (upper base and lower base). Note that the shape of the opening 121F only needs to be at least a trapezoidal shape and is preferably an isosceles trapezoidal shape.

Hereinafter, a minimum value (that is, a length of the upper base in the arrangement illustrated in FIG. 31) of the width (a length along the short side) of the opening 121F is referred to as a width W2a, and a maximum value (that is, a length of the lower base in the arrangement illustrated in FIG. 31) of the width of the opening 121F is referred to as a width W2b.

Among two regions of the mode converter 10F into which the mode converter 10F is divided by a B-B' line, which serves as a boundary and is a set of points equally dividing the width W1 of the post-wall waveguide PW, (1) a region on a side where the central axis (which can be said to be a C-C' line) of the strip-shaped conductor 16F is provided (a lower region in the arrangement illustrated in FIG. 31) is referred to as a first region, and (2) a region on a side where the central axis of the strip-shaped conductor 16F is not provided (an upper region in the arrangement illustrated in FIG. 31) is referred to as a second region. The opening 121F is provided in the conductor layer 12 such that a longer base, out of a pair of bases of the opening 121F, is located in the first region, while a shorter base is located in the second region. In other words, a distance from the central axis of the strip-shaped conductor 16F to the upper base exceeds a distance from the central axis of the strip-shaped conductor 16F to the lower base. Note that in the arrangement illustrated in FIG. 31, the upper base is a shorter base out of the pair of bases, and the lower base is a longer base out of the pair of bases.

The width W2a and the width W2b can be set as appropriate according to the operating band, the gap ΔG, and the like. However in the present embodiment, W2a=100 μm and W2b=400 μm are employed as the widths W2a and W2b, respectively.

The arrangement in which the central axis of the strip-shaped conductor 16E is provided so as to be displaced from the B-B' line as in the mode converter 10E illustrated in FIG. 28, may deteriorate the reflection characteristic and the transmission characteristic, as compared with the arrangement in which the central axis coincides with the B-B' line. In the mode converter 10F, the strip-shaped conductor 16F is provided such that the central axis of the strip-shaped conductor 16F is displaced from the B-B' line, and the opening 121F shaped in an isosceles trapezoid is employed. Thus, it is possible to suppress the deterioration of the reflection characteristic and transmission characteristic that may be caused by the arrangement in which the central axis of the strip-shaped conductor 16F is provided so as to be displaced from the B-B' line. That is, the mode converter 10F can suppress the deterioration of the reflection characteristic and transmission characteristic while increasing the degree of freedom of the arrangement of the strip-shaped conductor 16F.

Example Group 11

Figure 32:
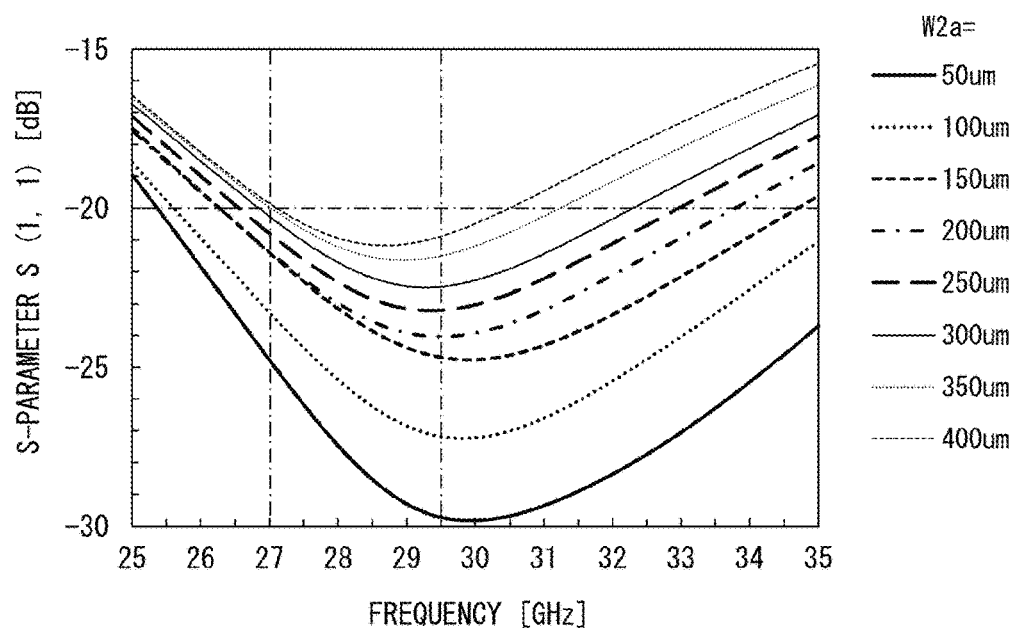
FIG. 32 is a graph showing respective reflection characteristics of the mode converters in accordance with Example Group 11 of the present invention.
Figure 33:
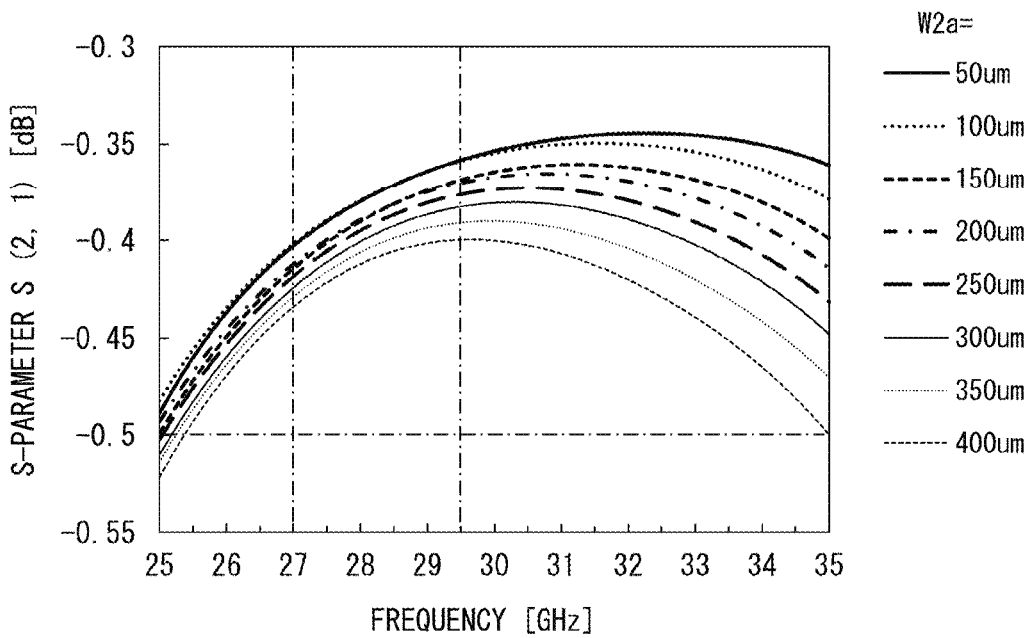
FIG. 33 is a graph showing respective transmission characteristics of the mode converters in accordance with Example Group 11 of the present invention.

The following description will discuss, with reference to FIGS. 32 and 33, mode converters 10F in accordance with Example Group 11 of the present invention, which is an example group of the mode converter 10F illustrated in FIG. 31. FIG. 32 is a graph showing respective reflection characteristics of the mode converters 10F of Example Group 11. FIG. 33 is a graph showing respective transmission characteristics of the mode converters 10F of Example Group 11.

The mode converter 10F of Example Group 11 is based on the mode converter 10E having ΔG=600 μm out of the mode converters 10E in accordance with Example Group 10, with the aim of realizing an operating band including a 28 GHz band in the mode converter 10F illustrated in FIG. 31. Then, the mode converter 10F of Example Group 11 is obtained by fixing the width W2b to 400 μm and changing the width W2a in a range of not less than 50 μm and not more than 400 μm. Note that of the plots shown in FIGS. 32 and 33, the plot of W2a=400 μm corresponds to the mode converter 10E having ΔG=600 μm.

Referring to FIG. 32, in the mode converter 10F of Example Group 11, it was found that the reflection characteristics are improved by reducing the width W2a from 400 μm to 50 μm. More specifically, in the mode converter 10F of Example Group 11, it was found that (1) in a case where the width W2a is not less than 50 μm and not more than 300 μm, the S-parameter S (1, 1) is below −20 dB in the operating band of not less than 27 GHz and not more than 29.5 GHz, and that (2) in a case where the width W2a is not less than 350 μm and not more than 400 μm, the S-parameter S (1, 1) is above −20 dB in a part of the above operating band.

Further, referring to FIG. 33, in the mode converters 10F of Example Group 11, it was found that the transmission characteristics are improved by reducing the width W2a from 400 μm to 50 μm. Note that in the mode converters 10F of Example Group 11, in a case where the width W2a is not less than 50 μm and not more than 400 μm, the S-parameter S (2, 1) is above −0.5 dB in the above operating band.

From the above results, it was found that it is preferable that the mode converters 10F of Example Group 11 employ, as the width W2a, a value included in the range of not less than 50 μm and not more than 300 μm, to exhibit excellent performance in the above operating band.

Example Group 12

Figure 34:
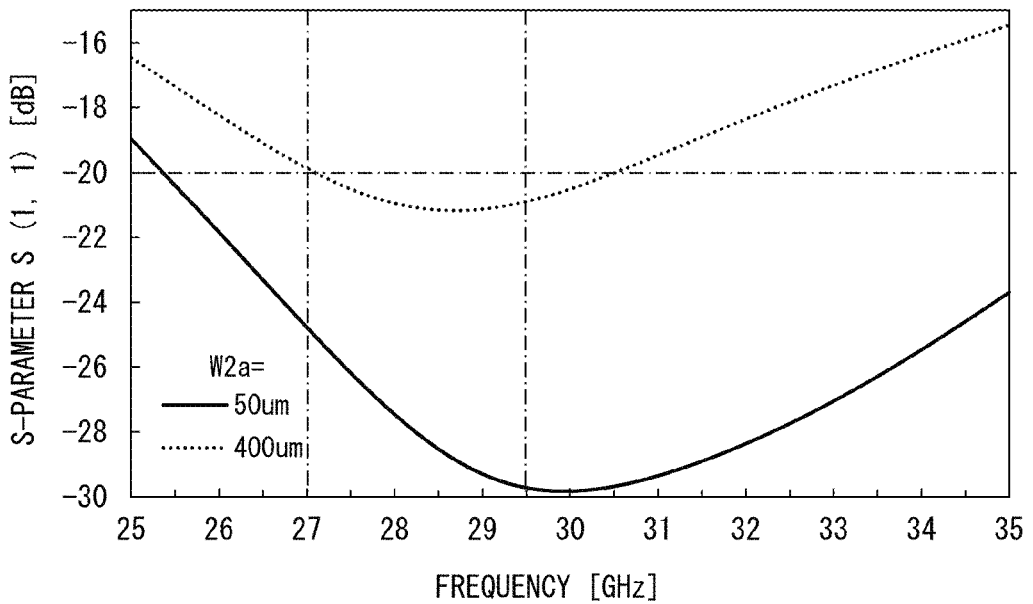
FIG. 34 is a graph showing respective reflection characteristics of the mode converters in accordance with Example Group 12 of the present invention.
Figure 35:
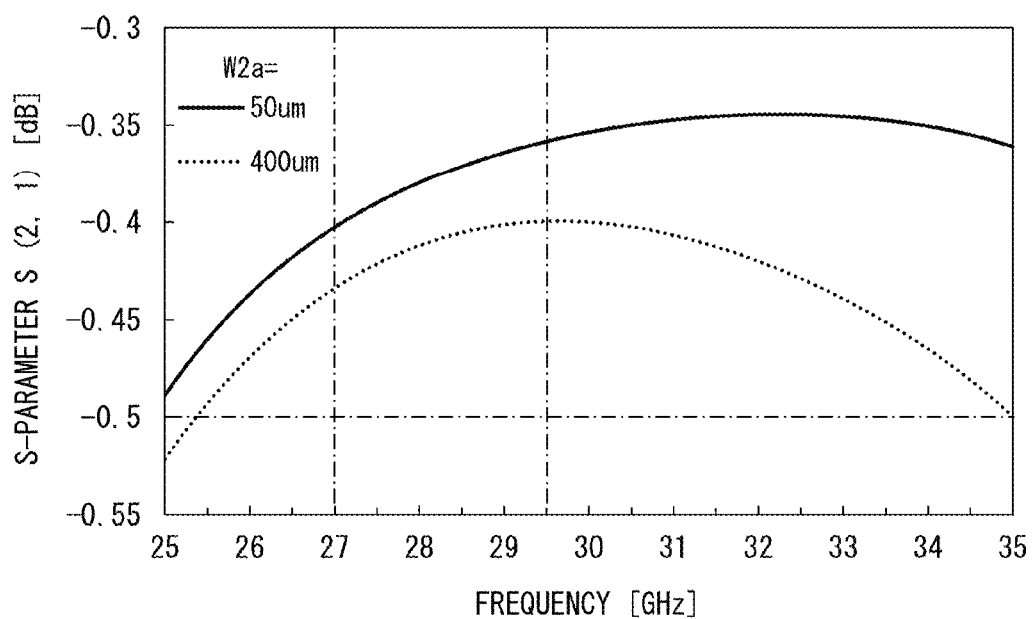
FIG. 35 is a graph showing respective transmission characteristics of the mode converters in accordance with Example Group 12 of the present invention.

The following description will discuss, with reference to FIGS. 34 and 35, mode converters 10F in accordance with Example Group 12 of the present invention, which is an example group of the mode converter 10F illustrated in FIG. 31. FIG. 34 is a graph showing respective reflection characteristics of the mode converters 10F of Example Group 12. FIG. 35 is a graph showing respective transmission characteristics of the mode converters 10F of Example Group 12.

The mode converter 10F of Example Group 12 is based on the mode converter 10E having ΔG=700 μm out of the mode converters 10E in accordance with Example Group 10, with the aim of realizing an operating band including a 28 GHz band in the mode converter 10F illustrated in FIG. 31. Then, the mode converter 10F of Example Group 12 is obtained by fixing the width W2b to 400 μm and employing 50 μm and 400 μm as the width W2a. Note that of the plots shown in FIGS. 34 and 35, the plot of W2a=400 μm corresponds to the mode converter 10E having ΔG=700 μm.

Referring to FIG. 34, in the mode converter 10F of Example Group 12, it was found that the reflection characteristics are improved by employing W2a=50 μm, as compared with the mode converter 10F employing W2a=400 μm. More specifically, in the mode converter 10F of Example Group 12, it was found that (1) in a case where the width W2a is 50 μm, the S-parameter S (1, 1) is below −20 dB in the operating band of not less than 27 GHz and not more than 29.5 GHz, and that (2) in a case where the width W2a is 400 μm, the S-parameter S (1, 1) is above −20 dB in a part of the above operating band.

Further, referring to FIG. 35, in the mode converters 10F of Example Group 12, it was found that the transmission characteristics are improved by employing W2a=50 μm, as compared with the mode converter 10F employing W2a=400 μm. In the mode converters 10F of Example Group 12, in a case where the width W2a is not less than 50 μm and not more than 400 μm, the S-parameter S (2, 1) is above −0.5 dB in the above operating band.

From the above results, it was found that it is preferable that the mode converters 10F of Example Group 12 employ, as the width W2a, a value included in the range of not less than 50 μm and not more than 400 μm, to exhibit excellent performance in the above operating band.

Embodiment 3

Figure 36:
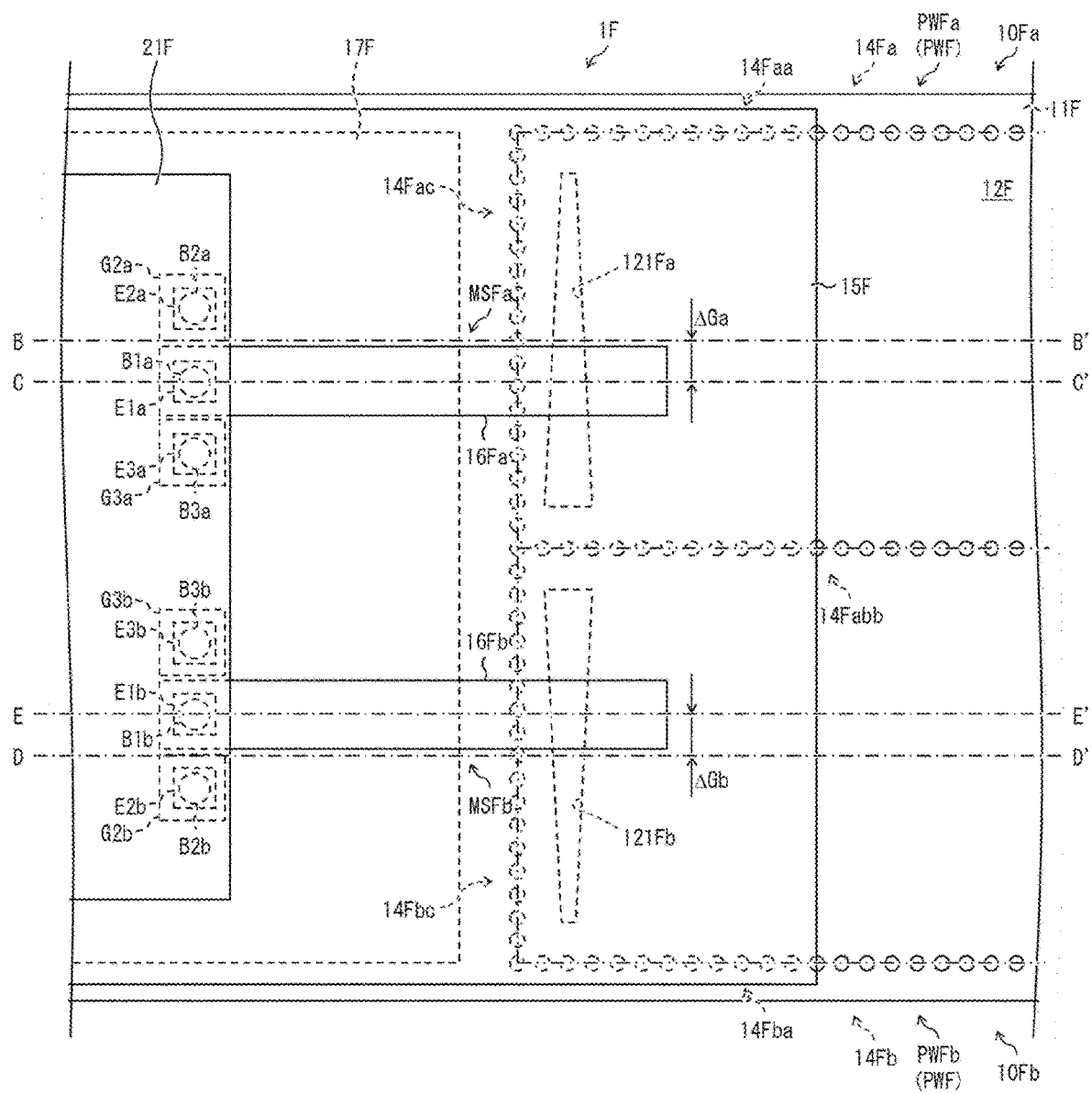
FIG. 36 is a plan view illustrating an RF module in accordance with Embodiment 3 of the present invention.

The following description will discuss, with reference to FIG. 36, an RF module 1F in accordance with Embodiment 3 of the present invention. FIG. 36 is a plan view illustrating the RF module 1F.

As illustrated in FIG. 36, the RF module 1F includes a mode converter 10Fa and a mode converter 10Fb, which are a pair of mode converters, and an RFIC 21F. The RFIC 21F is mounted on a first main surface of a substrate 15F, which includes a microstrip line MSFa of the mode converter 10Fa and a microstrip line MSFb of the mode converter 10Fb, wherein the first main surface is a main surface on a side farther from a post-wall waveguide PWFa of the mode converter 10Fa and a post-wall waveguide PWFb of the mode converter 10Fb.

The RFIC 21F includes an output port and an input port. The output port is composed of a signal terminal E1a and ground terminals E2a and E3a which are arranged such that the signal terminal E1a is sandwiched between the ground terminals E2a and E3a. The input port is composed of a signal terminal E1b and ground terminals E2b and E3b which are arranged such that the signal terminal E1b is sandwiched between the ground terminals E2b and E3b. That is, each of the output port and the input port is a port of a GSG arrangement in which the terminals are arranged in the order of the ground terminal, the signal terminal, and the ground terminal.

<Configuration of Mode Converters 10Fa and 10Fb>

Each of the mode converters 10Fa and 10Fb is a specific example of the mode converter 10F illustrated in FIG. 31, and is configured in the same manner as the mode converter 10F. Thus, in the present embodiment, the description regarding the mode converters 10Fa and 10Fb will only provide a correspondence between members constituting the mode converters 10Fa and 10Fb and the members constituting the mode converter 10F, and explanation of the members constituting the mode converters 10Fa and 10Fb will be omitted.

As illustrated in FIG. 36, the mode converters 10Fa and 10Fb include respective post-wall waveguides PWFa and PWFb, and respective microstrip lines MSFa and MSFb.

(Post-Wall Waveguides PWFa and PWFb)

The post-wall waveguide PWFa and the post-wall waveguide PWFb are arranged such that their respective extension directions are parallel to each other and the post-wall waveguide PWFa and the post-wall waveguide PWFb are close to each other. The post-wall waveguide PWFa and the post-wall waveguide PWFb are electromagnetically coupled in a region not illustrated in FIG. 36 to form one post-wall waveguide PWF. Thus, the post-wall waveguide PWFa is one end region of the post-wall waveguide PWF, and the post-wall waveguide PWFb is the other end region of the post-wall waveguide PWF. The shape of the post-wall waveguide PWF in a plan view is not particularly limited and can be determined as appropriate.

The post-wall waveguide PWFa includes a short wall 14*ac*, which is one short wall of a pair of short walls that constitute the post-wall waveguide PWF. The post-wall waveguide PWFb includes a short wall 14*bc*, which is the other short wall of the pair of short walls that constitute the post-wall waveguide PWF. In the post-wall waveguide PWFa, an opening 121Fa (an example of the first opening) is provided in the vicinity of the short wall 14*ac* in the conductor layer 12F constituting a first wide wall of the post-wall waveguide PWFa. In the post-wall waveguide PWFb, an opening 121Fb (an example of the second opening) is provided in the vicinity of the short wall 14*bc* in the conductor layer 12F constituting a first wide wall of the post-wall waveguide PWFb. The openings 121Fa and 121Fb correspond to the opening 121F in the mode converter 10F.

The openings 121Fa and 121Fb are shaped in an isosceles trapezoid. Note that the openings 121Fa and 121Fb are shaped in a trapezoid. In a plan view of the post-wall waveguide PWF, the opening 121Fa is arranged such that a pair of bases forming the shape of an isosceles trapezoid are parallel to a narrow wall 14Faa and a narrow wall 14Fabb constituting the post-wall waveguide PWFa, and such that a distance from a central axis of a strip-shaped conductor 16Fa (discussed later) to a shorter base out of the pair of bases of the opening 121Fa exceeds a distance from the central axis of the strip-shaped conductor 16Fa to a longer base out of the pair of bases of the opening 121Fa. Further, in a plan view of the post-wall waveguide PWF, the opening 121Fb is arranged such that a pair of bases forming the shape of an isosceles trapezoid are parallel to a narrow wall 14Fba and the narrow wall 14Fabb constituting the post-wall waveguide PWFb, and such that a distance from a central axis of a strip-shaped conductor 16Fb (discussed later) to a shorter base out of the pair of bases of the opening 121Fb exceeds a distance from the central axis of the strip-shaped conductor 16Fb to a longer base out of the pair of bases of the opening 121Fb. Further, the longer base out of the pair of bases of the opening 121Fa is on a side closer to the narrow wall 14Fabb, and the longer base out of the pair of bases of the opening 121Fb is on a side closer to the narrow wall 14Fabb.

The post-wall waveguides PWFa and PWFb and the microstrip lines MSFa and MSFb are joined with use of a solder (not illustrated in FIG. 36). This solder is an example of a joining member that short-circuits and joins the conductor layer 12F and the conductor layer 17F, and corresponds to the solder 18 provided in the mode converter 10.

The post-wall waveguide PWF has a cutoff frequency that depends on the shape and size of the waveguide region. Thus, the post-wall waveguide PWF functions as a high-pass filter. Further, in a case where a plurality of resonators that are electromagnetically coupled to each other are provided inside the waveguide region, the post-wall waveguide PWF functions as a bandpass filter. Thus, the RF module 1F can (1) subject, to a predetermined filtering process, a high frequency supplied from the output port of the RFIC 21F to the post-wall waveguide PWF via the microstrip line MSFa, and then (2) supply the high frequency subjected to the filtering process from the post-wall waveguide PWF to the input port of the RFIC 21F via the microstrip line MSFb.

The post-wall waveguide PWF including the post-wall waveguides PWFa and PWFb includes a substrate 11F and the conductor layers 12F and 13F. The substrate 11F and the conductor layers 12F and 13F are common members in the post-wall waveguide PWF including the post-wall waveguides PWFa and PWFb. Further, each of the post-wall waveguides PWFa and PWFb includes post walls 14Fa and 14Fb, respectively. The substrate 11F corresponds to the substrate 11 of the mode converter 10, the conductor layers 12F and 13F correspond to the conductor layers 12 and 13 of the mode converter 10, and the post walls 14Fa and 14Fb correspond to the post wall 14 of the mode converter 10. Note that the conductor layer 13F is not illustrated in FIG. 36.

In the RF module 1F, the post-wall waveguides PWFa and PWFb are arranged so that the directions in which the respective waveguide regions are extended are parallel to each other and an interval between the post-wall waveguides PWFa and PWFb are as narrow as possible. Thus, the post-wall waveguides PWFa and PWFb share the narrow wall 14Fabb that separates the post-wall waveguides PWFa and PWFb out of the narrow walls constituting the post walls 14Fa and 14Fb. The narrow wall 14Faa and the narrow wall 14Fabb, which form the post wall 14Fa together with the short wall 14Fac, are parallel to each other. Further, the narrow wall 14Fba and the narrow wall 14Fabb, which form the post wall 14Fb together with the short wall 14Fbc, are parallel to each other.

(Microstrip Lines MSFa and MSFb)

The microstrip lines MSFa and MSFb include the substrate 15F and the conductor layer 17F. The substrate 15F and the conductor layer 17F are common members in the microstrip lines MSFa and MSFb. The microstrip lines MSFa and MSFb include the strip-shaped conductors 16Fa and 16Fb, respectively. The substrate 15F corresponds to the substrate 15 of the mode converter 10, the conductor layer 17F corresponds to the conductor layer 17 of the mode converter 10, and the strip-shaped conductors 16Fa and 16Fb correspond to the strip-shaped conductor 16 of the mode converter 10. Further, the strip-shaped conductors 16Fa and 16Fb are an example of a third strip-shaped conductor and an example of a fourth strip-shaped conductor, respectively.

In the mode converter 10Fa, the mode of the microstrip line MSFa and the mode of the post-wall waveguide PWFa are coupled via a region in which a portion of the strip-shaped conductor 16Fa and a portion of the opening 121Fa overlap each other in a plan view. Similarly, in the mode converter 10Fb, the mode of the microstrip line MSFb and the mode of the post-wall waveguide PWFb are coupled via a region in which a portion of the strip-shaped conductor 16Fb and a portion of the opening 121Fb overlap each other in a plan view. That is, the mode converters 10Fa and 10Fb can each convert between these modes via the openings 121Fa and 121Fb which do not directly contact the strip-shaped conductor 16Fa and 16Fb, without using an excitation pin.

In the RF module 1F, the mode converters 10Fa and 10Fb are configured so as to be mirror symmetrical about a plane, as a plane of symmetry, including the central axes of the through-vias constituting the narrow wall 14Fabb.

As with the B-B' line indicated in FIG. 31, a B-B' line indicated in FIG. 36 is a straight line that is a set of points equally dividing the width of the post-wall waveguide PWFa. As with the C-C' line indicated in FIG. 31, a C-C' line indicated in FIG. 36 is a straight line that coincides with the central axis of the strip-shaped conductor 16Fa. A D-D' line indicated in FIG. 36 is a straight line that is a set of points equally dividing the width of the post-wall waveguide PWFb. An E-E' line indicated in FIG. 36 is a straight line that coincides with the central axis of the strip-shaped conductor 16Fb.

As illustrated in FIG. 36, the strip-shaped conductors 16Fa and 16Fb are arranged so as to be displaced in parallel by gaps ΔGa and ΔGb, respectively, in the direction in which the distance between the central axes of the strip-shaped conductors 16Fa and 16Fb approach each other, with reference to the position of the B-B' line and the position of the D-D' line, respectively. That is, in a plan view of the post-wall waveguide PWF, both the central axis of the strip-shaped conductor 16Fa and the central axis of the strip-shaped conductor 16Fb are located between the B-B' line and the D-D' line. Note that in the RF module 1F, ΔGa=ΔGb. Thus, hereinafter, the gaps ΔGa and ΔGb are also simply referred to as a gap ΔG.

<Configuration for Mounting RFIC 21F>

Out of a pair of tip parts of the strip-shaped conductor 16Fa, a tip part which is close to the opening 121Fa and protrudes from the opening 121Fa is referred to as a first tip part, and a tip part on a side farther from the opening 121Fa is referred to as a second tip part. The second tip part of the strip-shaped conductor 16Fa functions as a signal conductor pad for connecting to a signal terminal E1a of the RFIC 21F. On both sides of the second tip part of the strip-shaped conductor 16Fa, ground conductor pads G2a and G3a for connecting to ground terminals E2a and E3a of the RFIC 21F are formed so as to sandwich the second tip part therebetween. Each of the ground conductor pads G2a and G3a is short-circuited to the conductor layer 12F. As described above, in the second tip part of the strip-shaped conductor 16Fa and in the vicinity of the second tip part of the strip-shaped conductor 16Fa, is formed a terminal which is for connecting to an output port of the RFIC 21F and which has a GSG arrangement in which the conductor pads are arranged in the order of a ground conductor pad, a signal conductor pad, and a ground conductor pad.

The second tip part of the strip-shaped conductor 16Fa is connected to the signal terminal E1a with use of a bump B1a, and the ground conductor pads G2a and G3a are connected to the respective ground terminals E2a and E3a with use of respective bumps B2a and B3a.

Similarly, out of a pair of tip parts of the strip-shaped conductor 16Fb, a tip part which is close to the opening 121Fb and protrudes from the opening 121Fb is referred to as a first tip part, and a tip part on a side farther from the opening 121Fb is referred to as a second tip part. In the second tip part of the strip-shaped conductor 16Fb and in the vicinity of the second tip part of the strip-shaped conductor 16Fb, is formed a terminal which is for connecting to an input port of the RFIC 21F and which has a GSG arrangement. The terminal having the GSG arrangement is constituted by the second tip part of the strip-shaped conductor 16Fb and ground conductor pads G2b and G3b which are arranged so as to sandwich the second tip part therebetween. The second tip part of the strip-shaped conductor 16Fb is connected to the signal terminal E1b with use of a bump B1b, and the ground conductor pads G2b and G3b are connected to the respective ground terminals E2b and E3b with use of respective bumps B2b and B3b.

According to the RF module 1F, the configuration of the RF module 1F makes it possible to narrow, by 2 ΔG, an interval between the central axes of the strip-shaped conductors 16Fa and 16Fb, as compared with the configuration in which the strip-shaped conductor 16Fa is provided such that the central axis of the strip-shaped conductor 16Fa coincides with the B-B' line, and the strip-shaped conductor 16Fb is provided such that the central axis of the strip-shaped conductor 16Fb coincides with the D-D' line. Thus, even in a case where the RFIC 21F, in which an interval between the signal terminal E1a constituting the output port and the signal terminal E1b constituting the input port is narrower than the interval between the B-B' line and the D-D' line (that is, the widths of the post-wall waveguides PWFa and PWFb), is mounted on the microstrip lines MSFa and MSFb, the RFIC 21F can be easily mounted.

<Seventh Variation>

Figure 37:
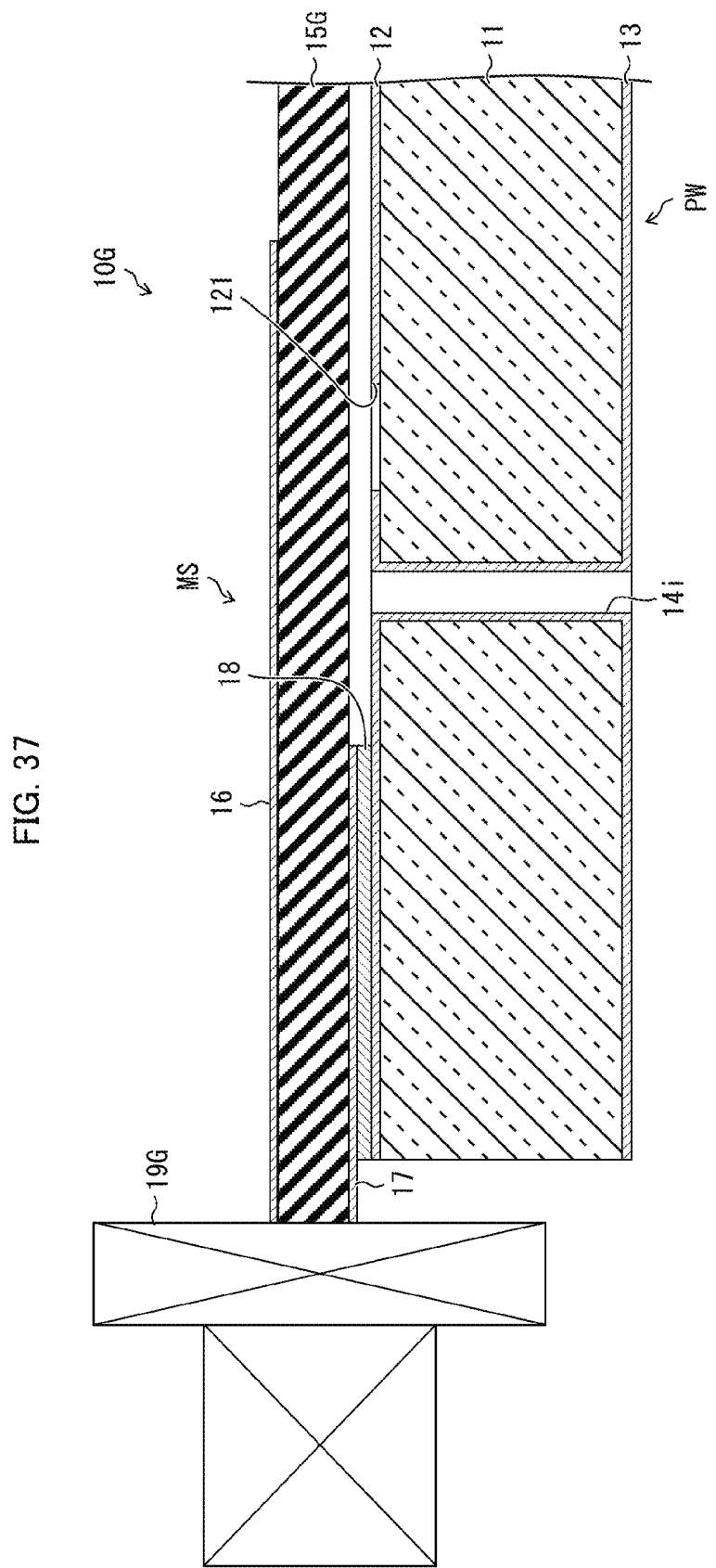
FIG. 37 is a cross-sectional view of a seventh variation of the mode converter illustrated in FIG. 1.

The following description will discuss, with reference to FIG. 37, a mode converter 10G in accordance with Seventh Variation of the present invention, which is a variation of the mode converter 10 illustrated in FIGS. 1 and 2. FIG. 37 is a cross-sectional view illustrating the mode converter 10G.

The mode converter 10G is based on the mode converter 10 and is obtained by adding a connector 19G to the mode converter 10. The connector 19G may be any connector that can transmit high frequencies included in a desired operating band, and can be appropriately selected from, for example, commercially available connectors. Thus, in the mode converter 10G, the internal structure of the connector 19G is not limited. Therefore, FIG. 37 omits the illustration of the internal structure of the connector 19G. In the present variation, a jack-side connector is employed, as the connector 19G, out of the jack-side connector and a plug-side connector both of which constitute a pair of coaxial connectors.

The connector 19G is fixed to a substrate 15G at an end portion of the microstrip line MS on a side opposite an end portion coupled to the post-wall waveguide PW via the opening 121.

The connector 19G, which is a coaxial connector, includes a central conductor and an outer conductor. The central conductor is electrically connected to the strip-shaped conductor 16 of the microstrip line MS. The outer conductor is also called a shell and is electrically connected to the conductor layer 17 of the microstrip line MS.

The mode converter 10G having such a configuration can convert, via the microstrip line MS, between the mode coupled to the connector 19G from outside and the mode of the post-wall waveguide PW. Moreover, the mode converter 10G does not use the excitation pin provided in the conventional mode converter, and thus brings about the same effect as the effect brought about by the mode converter 10.

Aspects of the present invention can also be expressed as follows:

In order to solve the above problem, a mode converter in accordance with a first aspect of the present invention includes: a post-wall waveguide in which an opening is provided in a first wide wall; a dielectric substrate having a first main surface and a second main surface on at least one of which a strip-shaped conductor is formed; and a joining member joining directly or indirectly the first wide wall and the substrate, wherein at least a portion of the opening and at least a portion of the strip-shaped conductor overlap each other in a plan view of the post-wall waveguide.

According to the above configuration, it is possible to couple, via the opening provided in the first wide wall of the post-wall waveguide, the mode of the post-wall waveguide and the mode of the line in which the strip-shaped conductor formed on another substrate different from the substrate of the post-walled waveguide serves as a signal line. That is, the present mode converter can convert between the mode of the post-wall waveguide and the mode of the line in which the strip-shaped conductor formed on another substrate different from the substrate of the post-walled waveguide serves as a signal line, without using an excitation pin provided in the conventional mode converter. Thus, the present mode converter is less likely to cause a transmission failure resulting from a change in environmental temperature than the conventional mode converter.

In a second aspect of the present invention, the mode converter is configured such that, in the first aspect of the present invention, the strip-shaped conductor constitutes a signal line of a TEM line or a quasi-TEM line.

Thus, the present mode converter is suitable as a mode converter that converts between the mode of the TEM line or the quasi-TEM line and the mode of the post-wall waveguide.

In a third aspect of the present invention, the mode converter is configured such that, in the second aspect of the present invention, the TEM line or the quasi-TEM line is any of a microstrip line, a strip line, a coplanar line, a grounded coplanar line, and a parallel two-wire line.

Thus, the present mode converter is suitable as a mode converter that converts between the mode of any of a microstrip line, a strip line, a coplanar line, a grounded coplanar line, and a parallel two-wire line and the mode of the post-wall waveguide.

In a fourth aspect of the present invention, the mode converter is configured such that, in any of the first to third aspects of the present invention, in a plan view of the post-wall waveguide, the strip-shaped conductor has a stub formed in a vicinity of a region where the strip-shaped conductor overlaps the opening.

According to the above configuration, designing the stub as appropriate achieves impedance matching and hence enables suppression of reflection loss in the present mode converter.

In a fifth aspect of the present invention, the mode converter is configured such that, in any of the first to fourth aspects of the present invention, the post-wall waveguide functions as any of a filter, a directional coupler, a diplexer, and an antenna.

The above configuration, when the line in which the strip-shaped conductor serves as a signal line is coupled to any of the filter, the directional coupler, the diplexer, and the antenna, can make it less likely to cause a transmission failure resulting from a change in environmental temperature than the conventional configuration.

In a sixth aspect of the present invention, the mode converter is configured such that, in any of the first to fifth aspects of the present invention, in a plan view of the post-wall waveguide, a pair of narrow walls constituting the post-wall waveguide are parallel to each other, and a straight line which is a set of points equally dividing a width of the post-wall waveguide and a central axis of the strip-shaped conductor are displaced from each other.

According to the above configuration, it is possible to provide the strip-shaped conductor such that the central axis of the strip-shaped conductor is displaced from the straight line which is a set of points equally dividing the width of the post-wall waveguide. This allows the present mode converter to increase the degree of freedom of the arrangement of the strip-shaped conductor.

In a seventh aspect of the present invention, the mode converter is configured such that, in the sixth aspect of the present invention, the opening is shaped in a trapezoid, and in a plan view of the post-wall waveguide, the opening is arranged such that a pair of bases forming the trapezoid are parallel to each of the pair of narrow walls, and a distance from the central axis to a shorter base out of the pair of bases exceeds a distance from the central axis to a longer base out of the pair of bases.

According to the above configuration, it is possible to suppress the deterioration of a reflection characteristic and transmission characteristic that may be caused by the arrangement in which the central axis of the strip-shaped conductor is provided so as to be displaced from the line which is a set of points equally dividing the width of the post-wall waveguide. That is, the present mode converter can suppress the deterioration of the reflection characteristic and transmission characteristic while increasing the degree of freedom of the arrangement of the strip-shaped conductor.

In an eighth aspect of the present invention, the mode converter is configured such that, in any of the first to seventh aspects of the present invention, the mode converter further includes a coaxial connector which includes a central conductor electrically connected to the strip-shaped conductor and is fixed to at least the substrate.

According to the above configuration, it is possible to convert, via the microstrip line, between the mode coupled to the coaxial connector from outside and the mode of the post-wall waveguide. Moreover, the present mode converter does not use the excitation pin provided in the conventional mode converter, and thus brings about the same effect as the effect brought about by the mode converter in accordance with the first aspect of the present invention.

In order to solve the above problem, an RF module in accordance with a ninth aspect of the present invention includes: a post-wall waveguide in which a first opening is provided in a vicinity of a first short wall of a first wide wall, and a second opening is provided in a vicinity of a second short wall of the first wide wall; a dielectric substrate having a first main surface and a second main surface, wherein a first strip-shaped conductor is formed on at least one of the first main surface and the second main surface, a second strip-shaped conductor is formed on at least one of the first main surface and the second main surface, and an antenna is formed on at least one of the first main surface and the second main surface; a joining member joining directly or indirectly the first wide wall and the substrate; and an RFIC being mounted on the first main surface of the substrate and having terminals any of which is electrically connected to the first strip-shaped conductor, wherein the antenna is electrically connected to the second strip-shaped conductor, and in a plan view of the post-wall waveguide, at least a portion of the first opening and at least a portion of the first strip-shaped conductor overlap each other, and at least a portion of the second opening and at least a portion of the second strip-shaped conductor overlap each other.

According to the above configuration, the present RF module, as with the mode converter in accordance with the first aspect of the present invention, can convert between the mode of the post-wall waveguide and the mode of the line in which the strip-shaped conductor connected to the RFIC serves as a signal line, and convert between the mode of the post-wall waveguide and the mode of the antenna, without using an excitation pin provided in the conventional mode converter. Thus, the present RF module is less likely to cause a transmission failure resulting from a change in environmental temperature than the conventional RF module.

In order to solve the above problem, the mobile terminal in accordance with a tenth aspect of the present invention includes the RF module in accordance with the ninth aspect as at least one of a transmission module, a reception module, and a transmission/reception module.

According to the above configuration, the present mobile terminal brings about the same effect as the effect brought about by the RF module in accordance with the sixth aspect of the present invention.

In order to solve the above problem, an RF module in accordance with an eleventh aspect of the present invention includes: a post-wall waveguide having a waveguide region formed by a pair of wide walls, narrow walls, and a pair of short walls, wherein (1) a first opening is provided in a first end region which is in a first wide wall of the pair of wide walls and includes a first short wall, (2) a second opening is provided in a second end region which is in the first wide wall of the pair of wide walls and includes a second short wall, and (3) the first end region and the second end region are arranged so as to be parallel to and close to each other; a dielectric substrate having a first main surface and a second main surface on at least one of which a third strip-shaped conductor and a fourth strip-shaped conductor are formed; a joining member joining directly or indirectly the first wide wall and the substrate; and an RFIC being mounted on the first main surface of the substrate and having an output terminal and an input terminal which are electrically connected to the third strip-shaped conductor and the fourth strip-shaped conductor, respectively, wherein in a plan view of the post-wall waveguide, at least a portion of the first opening and at least a portion of the third strip-shaped conductor overlap each other, and at least a portion of the second opening and at least a portion of the fourth strip-shaped conductor overlap each other.

According to the above configuration, it is possible to electromagnetically couple, via the third strip-shaped conductor, the output terminal of the RFIC and the first end region of the post-wall waveguide, and electromagnetically couple, via the fourth strip-shaped conductor, the second end region of the post-wall waveguide and the input terminal of the RFIC. This allows the present RF module to pass, through the post-wall waveguide, a mode supplied from the output terminal of the RFIC and then supply the mode to the input terminal of the RFIC. Moreover, the present RF module can couple the mode of the post-wall waveguide and the mode of the line in which the strip-shaped conductor formed on another substrate different from the substrate of the post-walled waveguide serves as a signal line, without using an excitation pin provided in the conventional mode converter. Thus, the present RF module brings about the same effect as the effect brought about by the mode converter in accordance with the first aspect of the present invention.

In a twelfth aspect of the present invention, the RF module is configured such that, in the eleventh aspects of the present invention, the post-wall waveguide functions as a filter.

According to the above configuration, it is possible to supply, to the input terminal of the RFIC, the mode obtained by subjecting the mode supplied from the output terminal of the RFIC to a filtering process.

In a thirteenth aspect of the present invention, the RF module is configured such that, in the eleventh or twelfth aspect of the present invention, in a plan view of the post-wall waveguide, the narrow walls constituting the first end region and the narrow walls constituting the second end region are parallel to each other, a straight line which is a set of points equally dividing a width of the first end region and a central axis of the third strip-shaped conductor are displaced from each other, and a straight line which is a set of points equally dividing a width of the second end region and a central axis of the fourth strip-shaped conductor are displaced from each other.

According to the above configuration, it is possible to provide the central axis of the third strip-shaped conductor so that the central axis of the third strip-shaped conductor is displaced from the straight line which is the set of points equally dividing the width of the first end region, and it is possible to provide the central axis of the fourth strip-shaped conductor so that the central axis of the fourth strip-shaped conductor is displaced from the straight line which is the set of points equally dividing the width of the second end region. Therefore, the present RF module can increase the degree of freedom of the arrangement of the third strip-shaped conductor and the fourth strip-shaped conductor according to a terminal-to-terminal distance between the output terminal and the input terminal of the RFIC.

In a fourteenth aspect of the present invention, the RF module is configured such that, in the thirteenth aspect of the present invention, the first opening and the second opening are each shaped in a trapezoid, and in a plan view of the post-wall waveguide, (1) the first opening is arranged such that a pair of bases forming the trapezoid are parallel to the narrow walls constituting the first end region, and a distance from the central axis of the third strip-shaped conductor to a shorter base out of the pair of bases of the first opening exceeds a distance from the central axis of the third strip-shaped conductor to a longer base out of the pair of bases of the first opening, and (2) the second opening is arranged such that a pair of bases forming the trapezoid are parallel to the narrow walls constituting the second end region, and a distance from the central axis of the fourth strip-shaped conductor to a shorter base out of the pair of bases of the second opening exceeds a distance from the central axis of the fourth strip-shaped conductor to a longer base out of the pair of bases of the second opening.

According to the above configuration, it is possible to suppress the deterioration of the reflection characteristic and transmission characteristic that may be caused by the arrangement in which the central axis of the third strip-shaped conductor is provided so as to be displaced from the straight line which is the set of points equally dividing the width of one waveguide region, and it is possible to suppress the deterioration of the reflection characteristic and transmission characteristic that may be caused by the arrangement in which the central axis of the fourth strip-shaped conductor is provided so as to be displaced from the straight line which is the set of points equally dividing the width of the other waveguide region. That is, the present RF module can suppress the deterioration of the reflection characteristic and transmission characteristic while increasing the degree of freedom of the arrangement of the third strip-shaped conductor and the fourth strip-shaped conductor according to the terminal-to-terminal distance between the output terminal and the input terminal of the RFIC.

In a fifteenth aspect of the present invention, the RF module is configured such that, in the thirteenth or fourteenth aspect of the present invention, in a plan view of the post-wall waveguide, the central axis of the third strip-shaped conductor and the central axis of the fourth strip-shaped conductor are located between the straight line which is the set of points equally dividing the width of the first end region and the straight line which is the set of points equally dividing the width of the second end region.

The terminal-to-terminal distance between the output terminal and the input terminal of the RFIC can be narrower than the distance between the straight line which is the set of points equally dividing the width of the one waveguide region and the straight line which is the set of points equally dividing the width of the other waveguide region. According to the above configuration, it is possible to make narrower an axis-to-axis distance between the central axis of the third strip-shaped conductor and the central axis of the fourth strip-shaped conductor by locating the central axis of the third strip-shaped conductor and the central axis of the fourth strip-shaped conductor between the straight line which is the set of points equally dividing the width of the one waveguide region and the straight line which is the set of points equally dividing the width of the other waveguide region. Therefore, the present RF module can further increase the degree of freedom of the arrangement of the third strip-shaped conductor and the fourth strip-shaped conductor according to the terminal-to-terminal distance between the output terminal and the input terminal of the RFIC.

SUPPLEMENTARY REMARKS

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST 10, 10A, 10B, 10C, 10D, 10E, 10F, 10Fa, 10Fb, 10G: mode converter
PW, PWFa, PWFb: post-wall waveguide
11: substrate
12, 13: conductor layer
121, 121F: opening
121Fa, 121Fb: opening (first opening, second opening)
14, 14Fa, 14Fb: post wall
14a, 14b, 14Faa, 14Fba, 14Fb: narrow wall
14c, 14Fac, 14Fbc: short wall
14i: through-via
15: substrate
16, 16B, 16C, 16E, 16F: strip-shaped conductor
16a, 16b: strip-shaped conductor (first strip-shaped conductor, second strip-shaped conductor)
16Fa, 16Fb: strip-shaped conductor (third strip-shaped conductor, fourth strip-shaped conductor)
16B1, 16B2: stub
16C1 first conductor pattern
16C2 second conductor pattern
16C3: through-via
17: conductor layer
18, 18C, 18D: solder (joining member)
18A: adhesive (joining member)
19G: connector
MS, MSFa, MSFb: microstrip line
1, 1F: RF module
21, 21F: RFIC
22: antenna

The invention claimed is:

1. A mode converter comprising:
a post-wall waveguide in which an opening is provided in a first wide wall;
a dielectric substrate having a first main surface and a second main surface on at least one of which a strip-shaped conductor is formed;
a joining member joining directly or indirectly the first wide wall and the substrate,
wherein at least a portion of the opening and at least a portion of the strip-shaped conductor overlap each other in a plan view of the post-wall waveguide,
the opening is shaped in a trapezoid, and
in a plan view of the post-wall waveguide, the opening is arranged such that a pair of bases forming the trapezoid are parallel to each of a pair of narrow walls constituting the post-wall waveguide, and a distance from a central axis of the strip-shaped conductor to a shorter base out of the pair of bases exceeds a distance from the central axis of the strip-shaped conductor to a longer base out of the pair of bases.

2. The mode converter according to claim 1, wherein the strip-shaped conductor constitutes a signal line of a TEM line or a quasi-TEM line.

3. The mode converter according to claim 2, wherein the TEM line or the quasi-TEM line is any of a microstrip line, a strip line, a coplanar line, a grounded coplanar line, and a parallel two-wire line.

4. The mode converter according to claim 1, wherein in a plan view of the post-wall waveguide, the strip-shaped conductor has a stub formed in a vicinity of a region where the strip-shaped conductor overlaps the opening.

5. The mode converter according to claim 1, wherein the post-wall waveguide functions as any of a filter, a directional coupler, a diplexer, and an antenna.

6. The mode converter according to claim 1, wherein in a plan view of the post-wall waveguide, a pair of narrow walls constituting the post-wall waveguide are parallel to each other, and a straight line which is a set of points equally dividing a width of the post-wall waveguide and a central axis of the strip-shaped conductor are displaced from each other.

7. The mode converter according to claim 1, further comprising:
a coaxial connector which includes a central conductor electrically connected to the strip-shaped conductor and is fixed to at least the substrate.

8. An RF module comprising:
a post-wall waveguide in which a first opening is provided in a vicinity of a first short wall of a first wide wall, and a second opening is provided in a vicinity of a second short wall of the first wide wall;

a dielectric substrate having a first main surface and a second main surface, wherein a first strip-shaped conductor is formed on at least one of the first main surface and the second main surface, a second strip-shaped conductor is formed on at least one of the first main surface and the second main surface, and an antenna is formed on at least one of the first main surface and the second main surface;

a joining member joining directly or indirectly the first wide wall and the substrate; and an RFIC being mounted on the first main surface of the substrate and having terminals any of which is electrically connected to the first strip-shaped conductor, wherein the antenna is electrically connected to the second strip-shaped conductor, in a plan view of the post-wall waveguide, at least a portion of the first opening and at least a portion of the first strip-shaped conductor overlap each other, and at least a portion of the second opening and at least a portion of the second strip-shaped conductor overlap each other, the first opening and the second opening are each shaped in a trapezoid, and in a plan view of the post-wall waveguide, the first opening is arranged such that a pair of bases forming the trapezoid are parallel to each of a pair of narrow walls constituting the post-wall waveguide, and a distance from a central axis of the first strip-shaped conductor to a shorter base out of the pair of bases of the first opening exceeds a distance from the central axis of the first strip-shaped conductor to a longer base out of the pair of bases of the first opening, and the second opening is arranged such that a pair of bases forming the trapezoid are parallel to each of the pair of narrow walls constituting the post-wall waveguide, and a distance from a central axis of the second strip-shaped conductor to a shorter base out of the pair of bases of the second opening exceeds a distance from the central axis of the second strip-shaped conductor to a longer base out of the pair of bases of the second opening.

9. A mobile terminal comprising an RF module according to claim 8 as at least one of a transmission module, a reception module, and a transmission/reception module.

10. An RF module comprising:

a post-wall waveguide having a waveguide region formed by a pair of wide walls, narrow walls, and a pair of short walls, wherein (1) a first opening is provided in a first end region which is in a first wide wall of the pair of wide walls and includes a first short wall, (2) a second opening is provided in a second end region which is in the first wide wall of the pair of wide walls and includes a second short wall, and (3) the first end region and the second end region are arranged so as to be parallel to and close to each other;

a dielectric substrate having a first main surface and a second main surface on at least one of which a third strip-shaped conductor and a fourth strip-shaped conductor are formed;

a joining member joining directly or indirectly the first wide wall and the substrate; and an RFIC being mounted on the first main surface of the substrate and having an output terminal and an input terminal which are electrically connected to the third strip-shaped conductor and the fourth strip-shaped conductor, respectively, wherein in a plan view of the post-wall waveguide, at least a portion of the first opening and at least a portion of the third strip-shaped conductor overlap each other, and at least a portion of the second opening and at least a portion of the fourth strip-shaped conductor overlap each other, the first opening and the second opening are each shaped in a trapezoid, and in a plan view of the post-wall waveguide, the first opening is arranged such that a pair of bases forming the trapezoid are parallel to the narrow walls constituting the first end region, and a distance from the central axis of the third strip-shaped conductor to a shorter base out of the pair of bases of the first opening exceeds a distance from the central axis of the third strip-shaped conductor to a longer base out of the pair of bases of the first opening, and the second opening is arranged such that a pair of bases forming the trapezoid are parallel to the narrow walls constituting the second end region, and a distance from the central axis of the fourth strip-shaped conductor to a shorter base out of the pair of bases of the second opening exceeds a distance from the central axis of the fourth strip-shaped conductor to a longer base out of the pair of bases of the second opening.

11. The RF module according to claim 10, wherein the post-wall waveguide functions as a filter.

12. The RF module according to claim 10, wherein in a plan view of the post-wall waveguide, the narrow walls constituting the first end region and the narrow walls constituting the second end region are parallel to each other, a straight line which is a set of points equally dividing a width of the first end region and a central axis of the third strip-shaped conductor are displaced from each other, and a straight line which is a set of points equally dividing a width of the second end region and a central axis of the fourth strip-shaped conductor are displaced from each other.

13. The RF module according to claim 12, wherein in a plan view of the post-wall waveguide, the central axis of the third strip-shaped conductor and the central axis of the fourth strip-shaped conductor are located between the straight line which is the set of points equally dividing the width of the first end region and the straight line which is the set of points equally dividing the width of the second end region.

* * * * *